United States Patent
Pang et al.

(10) Patent No.: US 12,283,247 B2
(45) Date of Patent: **\*Apr. 22, 2025**

(54) DISPLAY PANEL, DRIVING METHOD, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yuqian Pang, Beijing (CN); Yunsheng Xiao, Beijing (CN); Haigang Qing, Beijing (CN); Miao Wang, Beijing (CN); Tiaomei Zhang, Beijing (CN); Mengqi Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/434,932

(22) Filed: Feb. 7, 2024

(65) Prior Publication Data
US 2024/0177678 A1    May 30, 2024

Related U.S. Application Data

(63) Continuation of application No. 17/772,329, filed as application No. PCT/CN2020/087637 on Apr. 28, 2020, now Pat. No. 11,929,030.

(51) Int. Cl.
*G09G 3/32* (2016.01)
*G09G 3/3233* (2016.01)
(Continued)

(52) U.S. Cl.
CPC ......... *G09G 3/3266* (2013.01); *G09G 3/3233* (2013.01); *G11C 19/28* (2013.01);
(Continued)

(58) Field of Classification Search
CPC . G09G 3/3674–3677; G09G 2330/021; G09G 2330/06; G09G 3/20; H02M 1/4225; H02M 3/33507
See application file for complete search history.

(56) References Cited

U.S. PATENT DOCUMENTS 11,929,030 B2 *  3/2024  Pang ................. G11C 19/28
2011/0090184 A1    4/2011  Yamazaki et al.
(Continued)

FOREIGN PATENT DOCUMENTS

CN    104008779 A    8/2014
CN    104616616 A    5/2015
(Continued)

OTHER PUBLICATIONS

Extended European Search Report in EP20933067.9, mailed Oct. 19, 2022, 13 pages.
(Continued)

*Primary Examiner* — Roy P Rabindranath
(74) *Attorney, Agent, or Firm* — ArentFox Schiff LLP; Michael Fainberg

(57) ABSTRACT

A display panel, a driving method, and a display device. The display panel includes: a base substrate, subpixels, driving lines, data lines, a gate driving circuit including clock signal lines and shift register units arranged in extension direction of clock signal lines. The clock signal lines is divided into clock signal line groups; the shift register units is divided into register unit groups; the shift register units in same register unit group are cascaded, adjacent two of shift register units in the extension direction are in different
(Continued)

register unit groups; one register unit group corresponds to one clock signal line group; the gate of an input transistor is connected to a clock signal line in a corresponding clock signal line group, the second pole of input transistor is connected to the gate of an output transistor; the second pole of output transistor is connected to at least one driving line.

17 Claims, 17 Drawing Sheets

(51) Int. Cl.
 *G09G 3/3266* (2016.01)
 *G11C 19/28* (2006.01)
 *H10K 59/131* (2023.01)
(52) U.S. Cl.
 CPC ............... *G09G 2300/0408* (2013.01); *G09G 2300/0819* (2013.01); *G09G 2300/0852* (2013.01); *G09G 2300/0861* (2013.01); *G09G 2310/0286* (2013.01); *G09G 2310/08* (2013.01); *H10K 59/1315* (2023.02)

(56) References Cited

U.S. PATENT DOCUMENTS

| 2012/0044133 | A1 | 2/2012 | Nakamizo et al. |
| 2015/0348646 | A1 | 12/2015 | Wang et al. |
| 2016/0372023 | A1* | 12/2016 | Zhang .................. G09G 3/2092 |
| 2018/0144702 | A1 | 5/2018 | Furuta et al. |
| 2019/0304374 | A1 | 10/2019 | Wang et al. |
| 2020/0005698 | A1 | 1/2020 | Dai et al. |

FOREIGN PATENT DOCUMENTS

| CN | 105448261 A | 3/2016 |
| CN | 109801577 A | 5/2019 |
| JP | 2019-106540 A | 6/2019 |
| KR | 20190115546 A | 10/2019 |
| WO | 2010097986 A1 | 9/2010 |
| WO | 2011/007591 A1 | 1/2011 |
| WO | 2016190186 A1 | 12/2016 |

OTHER PUBLICATIONS

International Search Report in PCT/CN2020/087637, mailed Jan. 29, 2021, 6 pages.
Notice of Allowance in US17772329, mailed Nov. 16, 2023, 5 pages.
Office Action in IN202227042528, mailed Dec. 15, 2022, 7 pages.
Office Action in KR1020227017659, mailed Jan. 29, 2024, 8 pages.
Office Action in US17772329, mailed May 25, 2023, 14 pages.
Office Action received for Japanese Patent Application No. 2022-528658, mailed on Apr. 9, 2024, 6 pages (3 pages of English Translation and 3 pages of Original Document).
Decision to Grant received for Japanese Patent Application No. 2022-528658, mailed on Oct. 8, 2024, 8 pages (4 pages of English Translation and 4 pages of Original Document).

* cited by examiner

300

DISPLAY PANEL, DRIVING METHOD, AND DISPLAY DEVICE

CROSS-REFERENCE TO RELATED APPLICATIONS

This application is a continuation of U.S. application Ser. No. 17/772,329, filed on Apr. 27, 2022, which is a National Stage of International Application No. PCT/CN2020/087637, filed Apr. 28, 2020. The aforementioned applications are hereby incorporated by reference in their entireties.

FIELD

The present disclosure relates to the technical field of display, in particular to a display panel, a driving method, and a display device.

BACKGROUND

With rapid development of a display technology, a display device presents a development trend of high integration and low cost. A Gate Driver on Array (GOA, array substrate row drive) technology integrates a Thin Film Transistor (TFT) gate drive circuit on a base substrate of a display panel to form scan drive for the display panel, thereby saving a wiring space of a bonding region and a fan-out region of a gate Integrated Circuit (IC) to reduce a product cost.

SUMMARY

A display panel provided by an embodiment of the present disclosure includes:
  a base substrate, including a display region and a non-display region; wherein
  the display region includes:
  a plurality of subpixels, arranged in a matrix mode along a plurality of rows and a plurality of columns;
  a plurality of driving lines, wherein one row of the subpixels is correspondingly and electrically connected to at least one of the driving lines; and
  a plurality of data lines wherein one column of the subpixels is correspondingly and electrically connected to at least one of data lines; and
  the non-display region comprises:
  a gate driving circuit comprising: a plurality of clock signal lines, and a plurality of shift register units sequentially arranged in an extension direction of the clock signal lines, wherein the plurality of clock signal lines are divided into a plurality of clock signal line groups;
  the plurality of shift register units are divided into a plurality of register unit groups, wherein all shift register units in a same register unit group are cascaded, two shift register units adjacent in the extension direction of the clock signal lines are located in different register unit groups, and the different register unit groups correspond to different clock signal line groups; and
  each of the shift register units comprises an input transistor and an output transistor, wherein a gate of the input transistor is electrically connected to one clock signal line in a corresponding clock signal line group, a first pole of the input transistor is electrically connected to an input signal end, and a second pole of the input transistor is electrically connected to a gate of the output transistor; and a second pole of the output transistor is correspondingly and electrically connected to at least one driving line.

Optionally, in embodiments of the present disclosure, the display panel further includes:
  a semiconductor layer located on the base substrate, and comprising active layers of the input transistor and the output transistor, wherein each of the active layers comprises a source region, a drain region, and a channel region between the source region and the drain region;
  a gate insulating layer on one side facing away from the base substrate, of the semiconductor layer;
  a first conductive layer on one side facing away from the base substrate, of the gate insulating layer, and comprising the plurality of driving lines, a plurality of first connection lines, a plurality of second connection lines, the gate of the input transistor and the gate of the output transistor, wherein one of the shift register units corresponds to at least one of the first connection lines and at least one of the second connection lines;
  a first insulating layer on one side facing away from the base substrate, of the first conductive layer;
  a second conductive layer on one side facing away from the base substrate, of the first insulating layer, and comprising the plurality of data lines, the plurality of clock signal lines and a plurality of first transfer parts, wherein one first transfer part is electrically connected to the source region of the active layer of one output transistor; and the second conductive layer further comprises: a first power line, wherein
    for one shift register unit and the clock signal line group corresponding to the shift register unit, one end of the first connection line is directly electrically connected to the gate of the input transistor in the shift register unit, other end of the first connection line is electrically connected to one clock signal line in the clock signal line group through a first via hole, one end of the second connection line is electrically connected to the first transfer part through a second via hole, and other end of the second connection line is electrically connected to another clock signal line in the clock signal line group or the first power line through a third via hole; and
    the first via hole, the second via hole and the third via hole penetrate through the first insulating layer and are formed at intervals.

Optionally, in embodiments of the present disclosure, the plurality of clock signal lines is divided into two clock signal line groups, the two clock signal line groups comprise a first clock signal line group and a second clock signal line group, the first clock signal line group comprises a first clock signal line and a second clock signal line, and the second clock signal line group comprises a third clock signal line and a fourth clock signal line;
  the plurality of shift register units is divided into two register unit groups, the two register unit groups comprise a first register unit group and a second register unit group, the first register unit group comprises odd-numbered shift register units sequentially arranged in the extension direction of the clock signal lines, and the second register unit group comprises even-numbered shift register units sequentially arranged in the extension direction of the clock signal lines;
  for the plurality of shift register units cascaded in the first register unit group, a gate of the input transistor of an odd-numbered level of shift register units is electrically connected to the first clock signal line through a corresponding first connection line, and a first pole of the output transistor of the odd-numbered level of shift register units is electrically connected to the second clock signal line or the first power line through a corresponding second connection line; and, a gate of the input transistor of an even-numbered level of shift register units is electrically connected to the second clock signal line through a corresponding first connection line, and a first pole of the output transistor of the even-numbered level of shift register units is electrically connected to the first clock signal line or the first power line through a corresponding second connection line; and for the plurality of shift register units cascaded in the second register unit group, a gate of the input transistor of an odd-numbered level of shift register units is electrically connected to the third clock signal line through a corresponding first connection line, and a first pole of the output transistor of the odd-numbered level of shift register units is electrically connected to the fourth clock signal line or the first power line through a corresponding second connection line; and, a gate of the input transistor of an even-numbered level of shift register units is electrically connected to the fourth clock signal line through a corresponding first connection line, and a first pole of the output transistor of the even-numbered level of shift register units is electrically connected to the third clock signal line or the first power line through a corresponding second connection line.

Optionally, in embodiments of the present disclosure, each of the shift register units further includes a voltage-stabilizing transistor, wherein a second pole of the input transistor is electrically connected to a first pole of the voltage-stabilizing transistor, and a second pole of the voltage-stabilizing transistor is electrically connected to the gate of the output transistor; and the second conductive layer further includes: the first power line; and a gate of each voltage-stabilizing transistor is electrically connected to the first power line through a fourth via hole, wherein the fourth via hole penetrates through the first insulating layer.

Optionally, in embodiments of the present disclosure, in a same gate driving circuit, an orthographic projection of the input transistor on the base substrate is between an orthographic projection of the first power line on the base substrate and orthographic projections of the plurality of clock signal lines on the base substrate;

an orthographic projection of the voltage-stabilizing transistor on the base substrate is on one side of the orthographic projection of the first power line on the base substrate facing away from the orthographic projections of the plurality of clock signal lines on the base substrate; and an orthographic projection of the output transistor on the base substrate is on one side of the orthographic projection of the voltage-stabilizing transistor on the base substrate facing away from the orthographic projection of the first power line on the base substrate.

Optionally, in embodiments of the present disclosure, each of the shift register units further comprises a first control transistor and a second control transistor;

the semiconductor layer further comprises an active layer of the first control transistors and active layers of the second control transistors;

the first conductive layer further comprises: the gate of the first control transistors and the gate of the second control transistors;

the second conductive layer further comprises: a second power line, a plurality of second transfer parts, and a plurality of third transfer parts, wherein one second transfer part corresponds to one first control transistor, and one third transfer part corresponds to one second control transistor;

the display panel further comprises:

a fourth conductive layer between the first insulating layer and the second conductive layer, and the fourth conductive layer comprises a plurality of first conductive parts, wherein one first conductive part corresponds to one second control transistor; and a third insulating layer between the fourth conductive layer and the second conductive layer; wherein the gate of the first control transistor is directly electrically connected to a corresponding first connection line, a source region of the active layer of the first control transistor is electrically connected to the first power line through a fifth via hole, a drain region of the active layer of the first control transistor is electrically connected to a gate of the second control transistor through a corresponding second transfer part, and the fifth via hole penetrates through the first insulating layer and the third insulating layer; and a source region of the active layer of the second control transistor is electrically connected to one end of a corresponding third transfer part through a sixth via hole, other end of the third transfer part is electrically connected to one end of a corresponding first conductive part through a seventh via hole, other end of the first conductive part is electrically connected to the second power line through an eighth via hole, and a drain region of the active layers of the second control transistor is shared with the drain region of the active layer of the output transistor, wherein the sixth via hole penetrates through the first insulating layer and the third insulating layer, and the seventh via hole and the eighth via hole penetrate through the third insulating layer.

Optionally, in embodiments of the present disclosure, an orthographic projection of the second power line on the base substrate is between the orthographic projections of the plurality of clock signal lines on the base substrate and an orthographic projection of the gate driving circuit on the base substrate;

in each of the shift register units, an orthographic projection of the first control transistor on the base substrate is between the orthographic projection of the input transistor on the base substrate and the orthographic projection of the first power line on the base substrate; and in each of the shift register units, an orthographic projection of the second control transistor on the base substrate is on one side facing away from the orthographic projection of the first power line on the base substrate, of the orthographic projection of the input transistor on the base substrate.

Optionally, in embodiments of the present disclosure, in the shift register units, the active layer of the output transistor and the active layer of the second control transistor are disposed in an integrated structure.

Optionally, in embodiments of the present disclosure, each of the shift register units further comprises: a first capacitor and a second capacitor, a first pole of the first capacitor is electrically connected to the second power line, and a second pole of the first capacitor is electrically connected to the gate of the second control transistor; and a first pole of the second capacitor is electrically connected to the second pole of the output transistor, and a second pole of the second capacitor is electrically connected to the gate of the output transistor;

the fourth conductive layer further comprises a plurality of second conductive parts, wherein one second conductive part corresponds to one output transistor;

an orthographic projection of each of the first conductive parts on the base substrate and an orthographic projection of the gate of a corresponding second control transistor on the base substrate have an overlapped region, each of the first conductive parts serves as a first pole of a corresponding first capacitor, and the gate of the second control transistor serves as a second pole of the corresponding first capacitor; and an orthographic projection of each of the second conductive parts on the base substrate and an orthographic projection of the gate of a corresponding output transistor on the base substrate have an overlapped region, each of the second conductive parts serves as a first pole of a corresponding second capacitor, and the gate of the output transistor serves as a second pole of the corresponding second capacitors.

Optionally, in embodiments of the present disclosure, orthographic projections of gates of second control transistors on the base substrate cover orthographic projections of the first conductive parts on the base substrate.

Optionally, in embodiments of the present disclosure, the orthographic projections of the gates of the second control transistors on the base substrate and the orthographic projections of the first conductive parts on the base substrate respectively have overlapped regions with the orthographic projections of the first power lines on the base substrate.

Optionally, in embodiments of the present disclosure, an orthographic projection of the eighth via hole on the base substrate is between the orthographic projections of the first power lines on the base substrate and the orthographic projections of the second power lines on the base substrate, and an orthographic projection of the seventh via hole on the base substrate is between the orthographic projections of the first power lines on the base substrate and the orthographic projection of the active layer of the second control transistor on the base substrate.

Optionally, in embodiments of the present disclosure, the display panel further includes:

a second insulating layer located on one side facing away from the base substrate, of the second conductive layer;

a third conductive layer located on one side facing away from the base substrate, of the second insulating layer, and comprising: at least one auxiliary line, wherein one auxiliary line and one clock signal line are electrically connected through at least one ninth via hole, and the at least one ninth via hole penetrates through the second insulating layer.

Optionally, in embodiments of the present disclosure, the orthographic projections of the clock signal lines on the base substrate cover orthographic projections of the auxiliary lines electrically connected with the clock signal lines on the base substrate.

An embodiment of the present disclosure further provides a display device, including the above display panel.

An embodiment of the present disclosure further provides a driving method of the above display panel, including:

in one frame of scanning time, controlling all shift register units to work sequentially to scan all driving lines row by row, wherein odd-numbered shift register units and even-numbered shift register units sequentially arranged in an extension direction of a clock signal line are independently driven under control of different clock signal line groups.

An embodiment of the present disclosure further provides a driving method of the above display panel, including: time, for maintaining active level, of signals applied to a plurality of clock signal lines in different clock signal line groups do not overlap with each other.

DETAILED DESCRIPTION OF THE EMBODIMENTS

Figure 1:
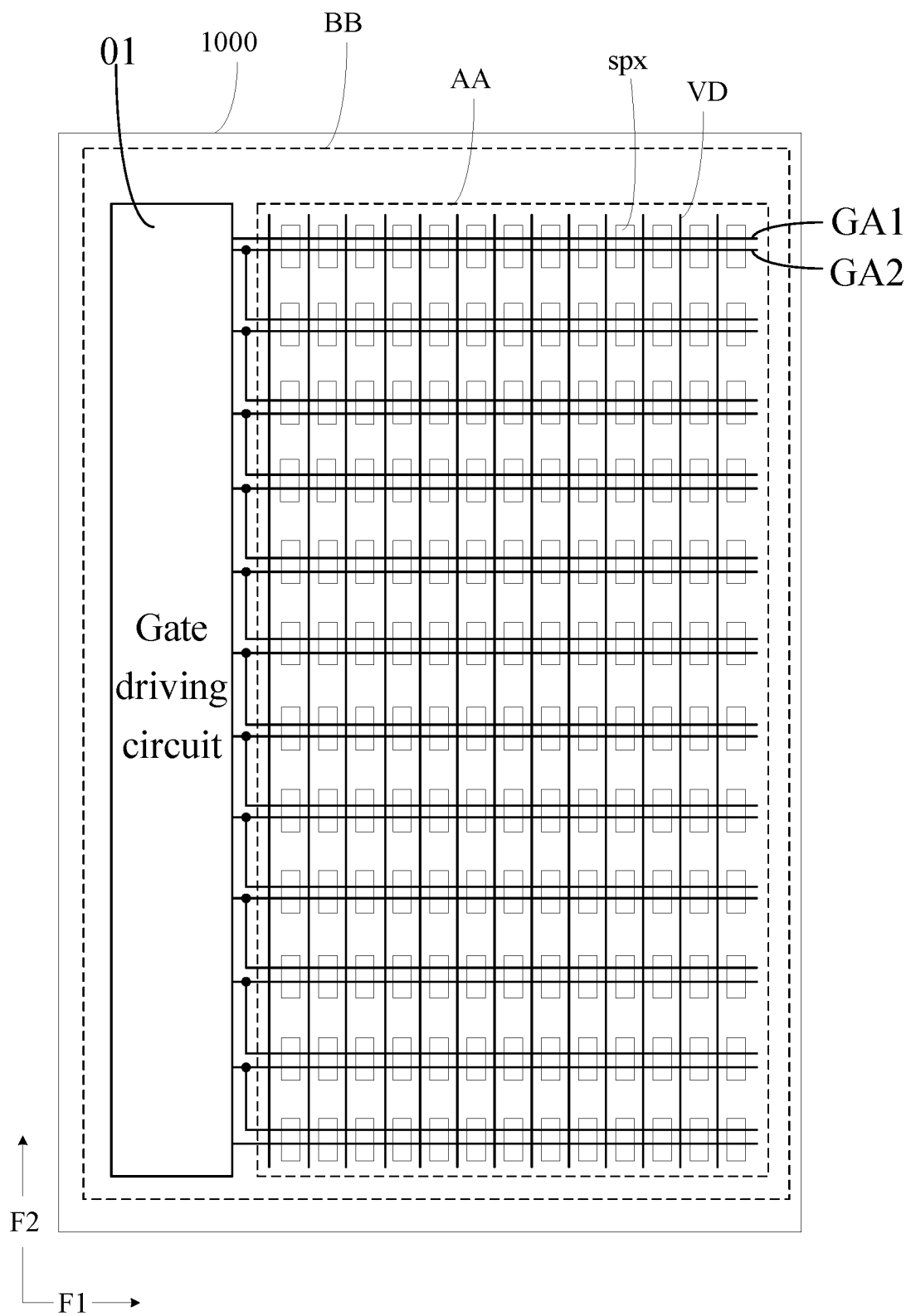
FIG. 1 is a schematic structural diagram of some display panels provided by an embodiment of the present disclosure.

In order to make the objective, technical solutions and advantages of the embodiments of the present disclosure more clear, the technical solutions of the embodiments of the present disclosure will be described clearly and completely with reference to drawings of the embodiments of the present disclosure. Obviously, the described embodiments are part of the embodiments of the present disclosure, but not all the embodiments. The embodiments in the present disclosure and features in the embodiments may be mutually combined in the case of no conflict. On the basis of the described embodiments of the present disclosure, all other embodiments obtained by those ordinarily skilled in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The words "first", "second" and the like used in the present disclosure do not indicate any order, quantity or importance, but are only used to distinguish different components. The word "including" or "containing" and the like, means that an element or item preceding the word covers an element or item listed after the word and the equivalent thereof, without excluding other elements or items. The word "connection" or "coupling" and the like is not restricted to physical or mechanical connection, but may include electrical connection, whether direct or indirect.

It should be noted that sizes and shapes of all graphs in the drawings do not reflect the true scale, and only intend to illustrate the content of the present disclosure. The same or similar reference numbers represent the same or similar elements or elements with the same or similar functions from beginning to end.

As shown in FIG. 1, a display panel provided by an embodiment of the present disclosure may include: a base substrate 1000. The base substrate 1000 may include a display region AA and a non-display region BB. The non-display region BB may surround the display region. The display region AA may include a plurality of pixel units PX, and each pixel unit PX may include a plurality of subpixels spx. The plurality of subpixels is arranged in a matrix mode along a plurality of rows and a plurality of columns.

Figure 2:
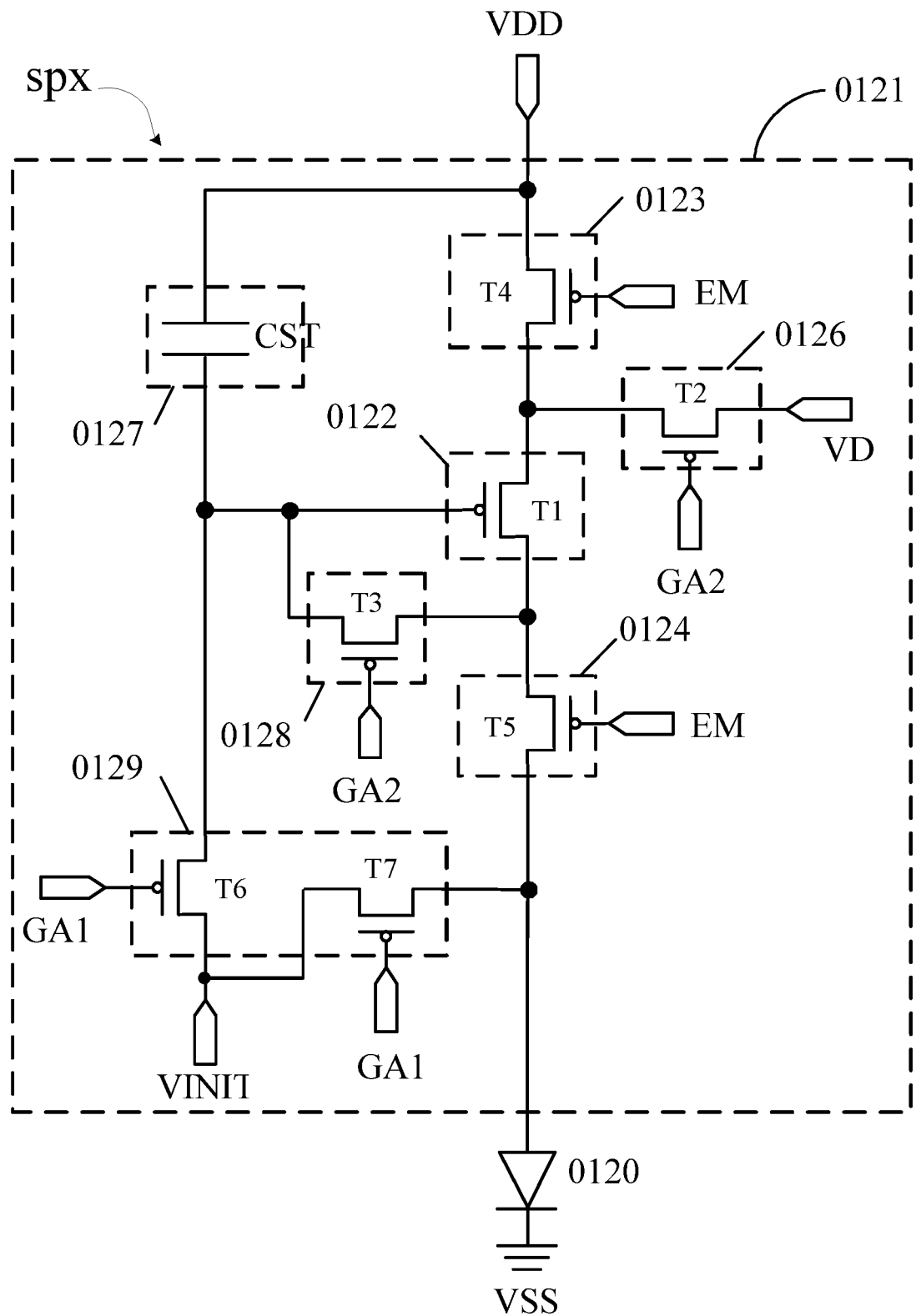
FIG. 2 is a schematic structural diagram of a pixel driving circuit in some subpixels provided by an embodiment of the present disclosure.

Exemplarily, as shown in FIG. 1 and FIG. 2, at least one subpixel spx in the plurality of subpixels spx may include: a pixel driving circuit 0121 and a light-emitting device 0120. The pixel driving circuit 0121 has a transistor and a capacitor, and generates an electrical signal through interaction of the transistor and the capacitor, and the generated electrical signal is input to a first electrode of the light-emitting device 0120. Moreover, a corresponding voltage is loaded to a second electrode of the light-emitting device 0120, so that the light-emitting device 0120 can be driven to emit light.

As shown with reference to FIG. 2, the pixel driving circuit 0121 may include: a driving control circuit 0122, a first light-emitting control circuit 0123, a second light-emitting control circuit 0124, a data writing circuit 0126, a storage circuit 0127, a threshold compensation circuit 0128 and a reset circuit 0129.

The driving control circuit 0122 may include a control end, a first pole and a second pole. The driving control circuit 0122 is configured to provide the light-emitting device 0120 with a driving current for driving the light-emitting device 0120 to emit light. For example, the first light-emitting control circuit 0123 is connected to the first pole of the driving control circuit 0122 and a first voltage end VDD. The first light-emitting control circuit 0123 is configured to realize connection conduction or disconnection between the driving control circuit 0122 and the first voltage end VDD.

The second light-emitting control circuit 0124 is electrically connected to the second pole of the driving control circuit 0122 and the first electrode of the light-emitting device 0120. The second light-emitting control circuit 0124 is configured to realize connection conduction or disconnection between the driving control circuit 0122 and the light-emitting device 0120.

The data writing circuit 0126 is electrically connected to the first pole of the driving control circuit 0122. The second light-emitting control circuit 0124 is configured to write a signal on a data line VD into the storage circuit 0127 under control of a signal on a scan line GA2.

The storage circuit 0127 is electrically connected to the control end of the driving control circuit 0122 and the first voltage end VDD. The storage circuit 0127 is configured to store a data signal.

The threshold compensation circuit 0128 is electrically connected to the control end and the second pole of the driving control circuit 0122. The threshold compensation circuit 0128 is configured to perform threshold compensation on the driving control circuit 0122.

The reset circuit 0129 is electrically connected to the control end of the driving control circuit 0122 and the first electrode of the light-emitting device 0120. The reset circuit 0129 is configured to reset the control end of the driving control circuit 0122 and the first electrode of the light-emitting device 0120 under control of a signal on a scan line GA1.

The light-emitting device 0120 may be disposed as an electroluminescent diode, such as at least one of OLED and QLED. The light-emitting device 0120 may include the first electrode, a light-emitting functional layer, and the second electrode disposed in a stack mode. Exemplarily, the first electrode may be an anode and the second electrode may be a cathode. The light-emitting functional layer may include a light-emitting layer. Further, the light-emitting functional layer may further include film layers such as a hole injection layer, a hole transport layer, the light-emitting layer, an electron transport layer, and an electron injection layer. Of course, in practical application, the light-emitting device 0120 may be designed and determined according to requirements of the actual application environment, which is not limited here.

Exemplarily, as shown in FIG. 2, the driving control circuit 0122 includes: a drive transistor T1, the control end of the driving control circuit 0122 includes a gate of the drive transistor T1, the first pole of the driving control circuit 0122 includes a first pole of the drive transistor T1, and the second pole of the driving control circuit 0122 includes a second pole of the drive transistor T1.

Exemplarily, as shown in FIG. 2, the data writing circuit 0126 includes a data writing transistor T2. The storage circuit 0127 includes a storage capacitor CST. The threshold compensation circuit 0128 includes a threshold compensation transistor T3. The first light-emitting control circuit 0123 includes a first light-emitting control transistor T4. The second light-emitting control circuit 0124 includes a second light-emitting control transistor T5. The reset circuit 0129 includes a first reset transistor T6 and a second reset transistor T7.

Optionally, a first pole of the data writing transistor T2 is electrically connected to the first pole of the drive transistor T1, a second pole of the data writing transistor T2 is configured to be electrically connected to the data line VD to receive the data signal, and a gate of the data writing transistor T2 is configured to be electrically connected to the second scan line GA2 to receive a scan signal.

A first pole of the storage capacitor CST is electrically connected to a first power end VDD, and a second pole of the storage capacitor CST is electrically connected to the gate of the drive transistor T1.

A first pole of the threshold compensation transistor T3 is electrically connected to the second pole of the drive transistor T1, a second pole of the threshold compensation transistor T3 is electrically connected to the gate of the drive transistor T1, and a gate of the threshold compensation transistor T3 is configured to be electrically connected to the second scan line GA2 to receive a signal.

A first pole of a first reset transistor T6 is configured to be electrically connected to a reset signal line VINIT to receive a reset signal, a second pole of the first reset transistor T6 is electrically connected to the gate of the drive transistor T1, and a gate of the first reset transistor T6 is configured to be electrically connected to the first scan line GA1 to receive a signal.

A first pole of a second reset transistor T7 is configured to be electrically connected to the reset signal line VINIT to receive the reset signal, a second pole of the second reset transistor T7 is electrically connected to the first electrode of the light-emitting device 0120, and a gate of the second reset transistor T7 is configured to be electrically connected to the first scan line GA1 to receive a signal.

A first pole of the first light-emitting control transistor T4 is electrically connected to the first power end VDD, a second pole of the first light-emitting control transistor T4 is electrically connected to the first pole of the drive transistor T1, and a gate of the first light-emitting control transistor T4 is configured to be electrically connected to a light-emitting control line EM to receive a light-emitting control signal.

A first pole of the second light-emitting control transistor T5 is electrically connected to the second pole of the drive transistor T1, a second pole of the second light-emitting control transistor T5 is electrically connected to the first electrode of the light-emitting device 0120, and a gate of the second light-emitting control transistor T5 is configured to be electrically connected to the light-emitting control line EM to receive the light-emitting control signal.

The second electrode of the light-emitting device 0120 is electrically connected to a second power end VSS. The first poles and the second poles of the above transistors may be determined as source electrodes or drain electrodes according to practical application, which are not limited here.

Exemplarily, one of the first power end VDD and the second power end VSS is a high voltage end, and the other is a low voltage end. For example, in the embodiment shown in FIG. 2, the first power end VDD is a voltage source to output a constant first voltage, and the first voltage is a positive voltage; and the second power end VSS may be a voltage source to output a constant second voltage, the second voltage is a negative voltage. For example, in some examples, the second power end VSS may be grounded.

Figure 3:
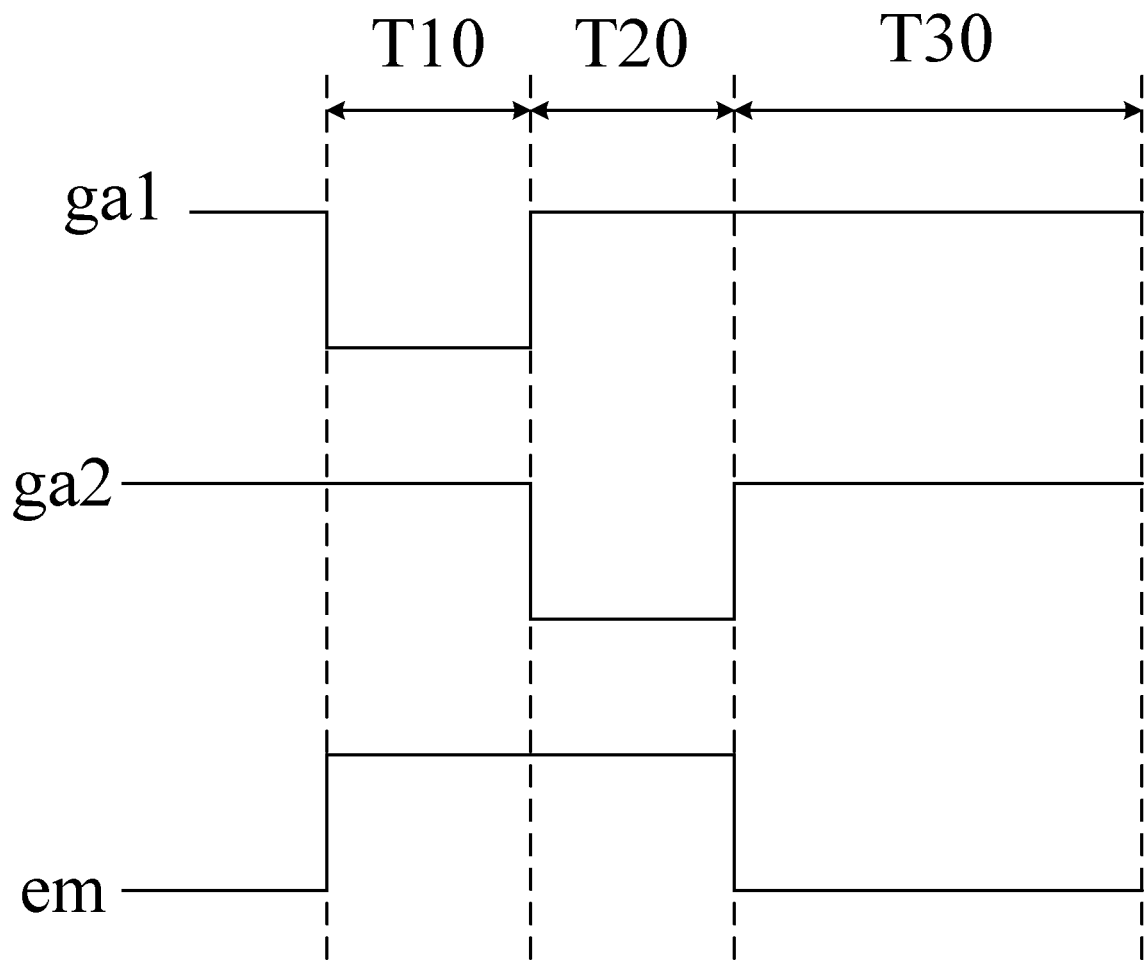
FIG. 3 is a signal sequence diagram of some pixel driving circuits provided by an embodiment of the present disclosure.

A signal timing diagram corresponding to the pixel driving circuit shown in FIG. 2 is shown in FIG. 3. In one frame of display time, a working process of the pixel driving circuit has three stages: a T10 stage, a T20 stage, and a T30 stage. ga1 represents the signal transmitted on the first scan line GA1, ga2 represents the signal transmitted on the second scan line GA2, and em represents the signal transmitted on the light-emitting control line EM.

In the stage T10, the signal ga1 controls the first reset transistor T6 and the second reset transistor T7 to be conducted. The conducted first reset transistor T6 provides the signal transmitted on the reset signal line VINIT to the gate of the drive transistor T1 to reset the gate of the drive transistor T1. The conducted second reset transistor T7 provides the signal transmitted on the reset signal line VINIT to the first electrode of the light-emitting device 0120 to reset the first electrode of the light-emitting device 0120. Moreover, in this stage, the signal ga2 controls both the data writing transistor T2 and the threshold compensation transistor T3 to be cut off. The signal em controls both the first light-emitting control transistor T4 and the second light-emitting control transistor T5 to be cut off.

In the T20 stage, the signal ga2 controls both the data writing transistor T2 and the threshold compensation transistor T3 to be conducted, so that the data signal transmitted on the data line VD may charge the gate of the drive transistor T1, and thus the gate of the drive transistor T1 becomes: Vdata+|Vth|. Vth represents a threshold voltage of the drive transistor T1, and Vdata represents the voltage of the data signal. Moreover, in this stage, the signal ga1 controls both the first reset transistor T6 and the second reset transistor T7 to be cut off. The signal em controls both the first light-emitting control transistor T4 and the second light-emitting control transistor T5 to be cut off.

In the T30 stage, the signal em controls both the first light-emitting control transistor T4 and the second light-emitting control transistor T5 to be conducted. The conducted first light-emitting control transistor T4 provides the voltage Vdd of the first power end VDD to the first pole of the drive transistor T1, so that the voltage of the first pole of the drive transistor T1 is Vdd. The drive transistor T1 generates a drive current according to the gate voltage Vdata+|Vth| and the voltage Vdd of the first pole. The drive current is provided to the light-emitting device 0120 through the conducted second light-emitting control transistor T5 to drive the light-emitting device 0120 to emit light. Moreover, in this stage, the signal ga1 controls both the first reset transistor T6 and the second reset transistor T7 to be cut off. The signal ga2 controls both the data writing transistor T2 and the threshold compensation transistor T3 to be cut off.

It should be noted that, in embodiments of the present disclosure, the pixel driving circuit in the subpixel may further be a structure including other numbers of transistors in addition to the structure shown in FIG. 2, which is not limited in embodiments of the present disclosure.

During specific implementation, in embodiments of the present disclosure, as shown in FIG. 1, the display region may include a plurality of driving lines and a plurality of data lines, wherein, one row of the subpixels is correspondingly and electrically connected to the at least one driving line, and one column of the subpixels is correspondingly and electrically connected to the at least one data line. Exemplarily, the driving lines include at least one of a plurality of scan lines and a plurality of light-emitting control lines. The one row of the subpixels is correspondingly and electrically connected to the at least one scan line and the at least one light-emitting control line. Exemplarily, if the pixel driving circuit is set to be the structure shown in FIG. 2, the one column of the subpixels may be correspondingly and electrically connected to the at least one data line or subpixels located in different rows in one column of the subpixels may be correspondingly and electrically connected to the two data lines respectively. One row of the subpixels corresponds to one light-emitting control line. The plurality of scan lines may include a plurality of first scan lines and a plurality of second scan lines, and one row of the subpixels is correspondingly and electrically connected to the two scan lines, that is, one row of the subpixels is correspondingly and electrically connected to one first scan line and one second scan line. In addition, in every two adjacent rows, the second scan line correspondingly and electrically connected to the first row and the first scan line correspondingly and electrically connected to the second row are electrically connected to transmit the same signal.

Figure 6:
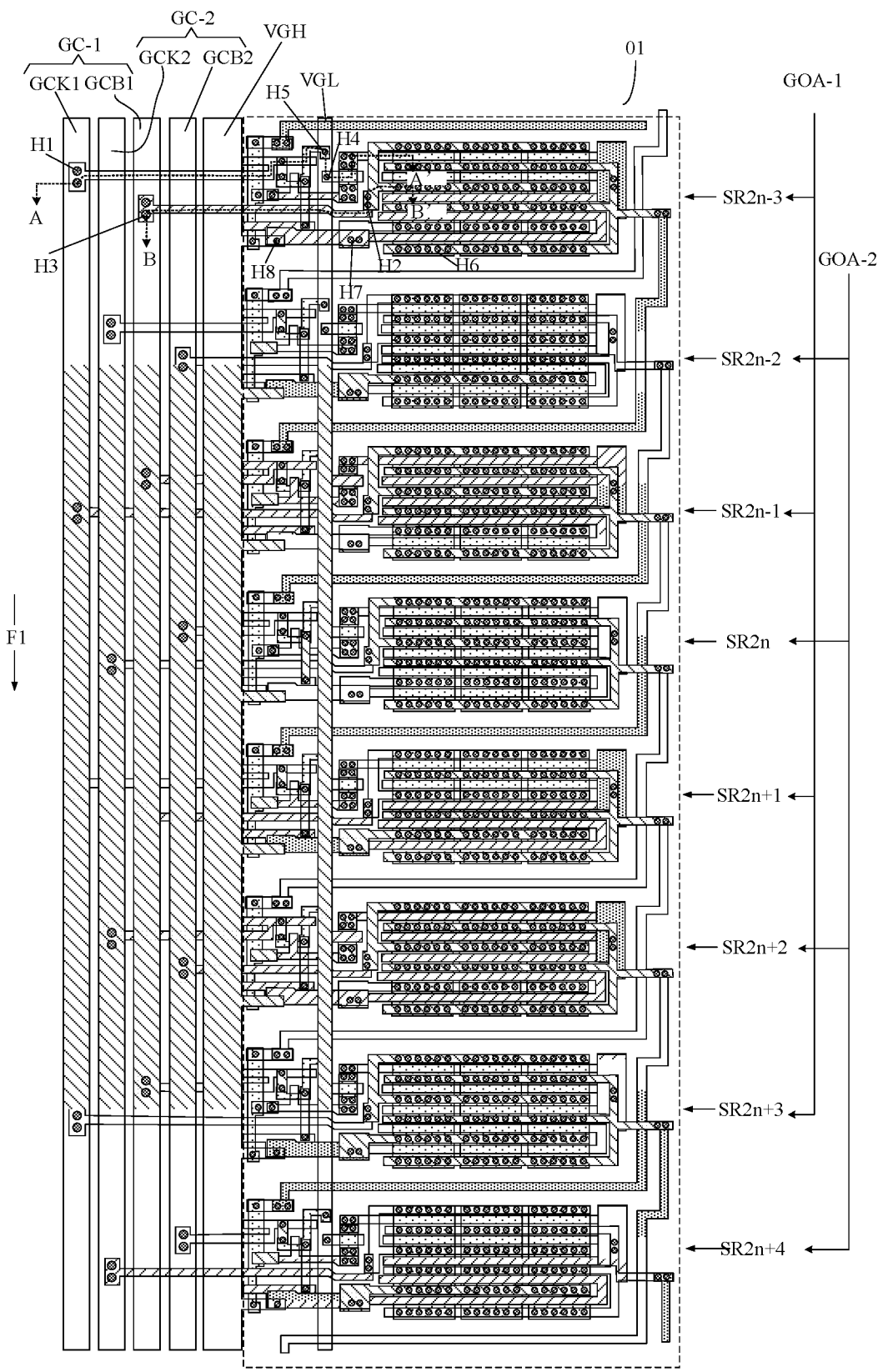
FIG. 6 is a schematic diagram of a layout structure of some gate driving circuits provided by an embodiment of the present disclosure.

In order to make the first scan line and the second scan line to transmit the signal, during specific implementation, in embodiments of the present disclosure, as shown in FIG. 1 and FIG. 6, the non-display region BB may include: a gate driving circuit 01 and a plurality of clock signal lines. An extension direction of the clock signal lines is different from an extension direction of the scan lines, for example, the extension direction of the clock signal lines and the extension direction of the scan lines intersect. The plurality of clock signal lines are disposed on one side of the gate driving circuit 01 facing away from the scan lines at intervals. Exemplarily, the gate driving circuit 01 may include: a plurality of shift register units SR2$n$–3, SR2$n$–2, SR2$n$–1, SR2$n$, SR2$n$+1, SR2$n$+2, SR2$n$+3 and SR2$n$+4 ($n$ is an integer greater than 0) sequentially arranged in the extension direction F1 of the clock signal lines. Exemplarily, an output signal end OP of one shift register unit may be correspondingly and electrically connected to at least one driving line. Exemplarily, the output signal end OP of one shift register unit may be correspondingly and electrically connected to at least one scan line. The output signal end OP of one shift register unit may also be correspondingly and electrically connected to at least one light-emitting control line.

Figure 4A:
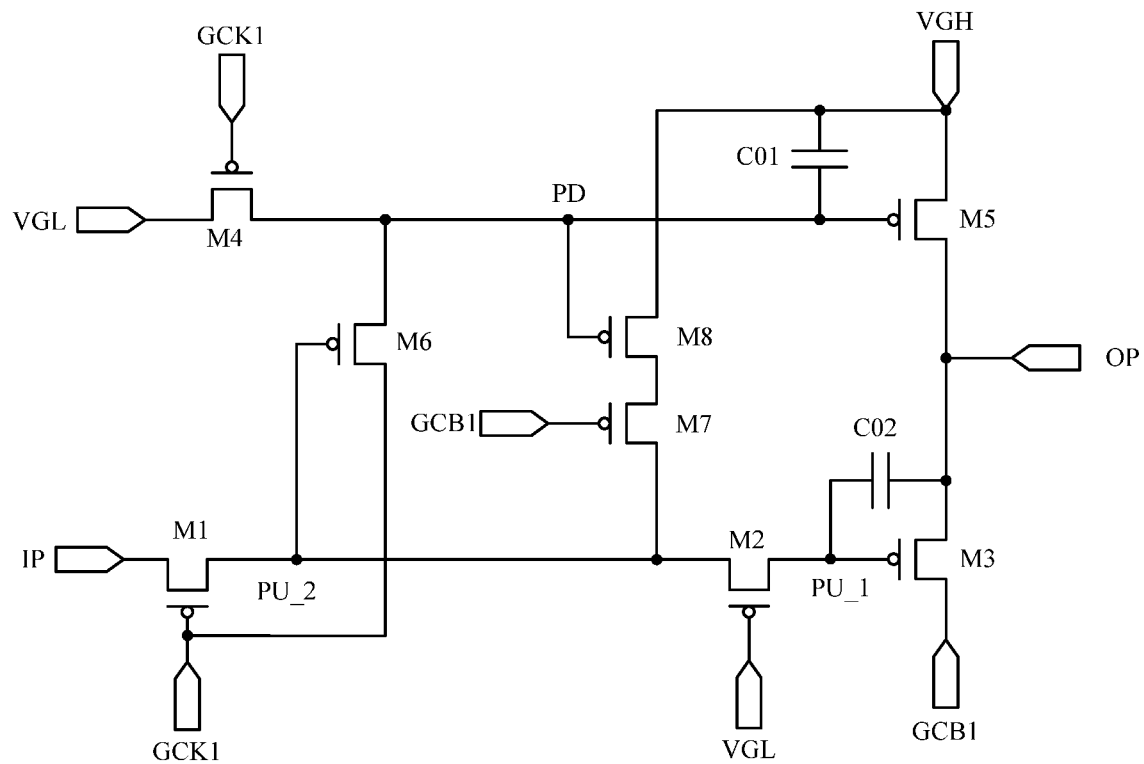
FIG. 4A is a schematic structural diagram of some shift register units provided by an embodiment of the present disclosure.
Figure 4B:
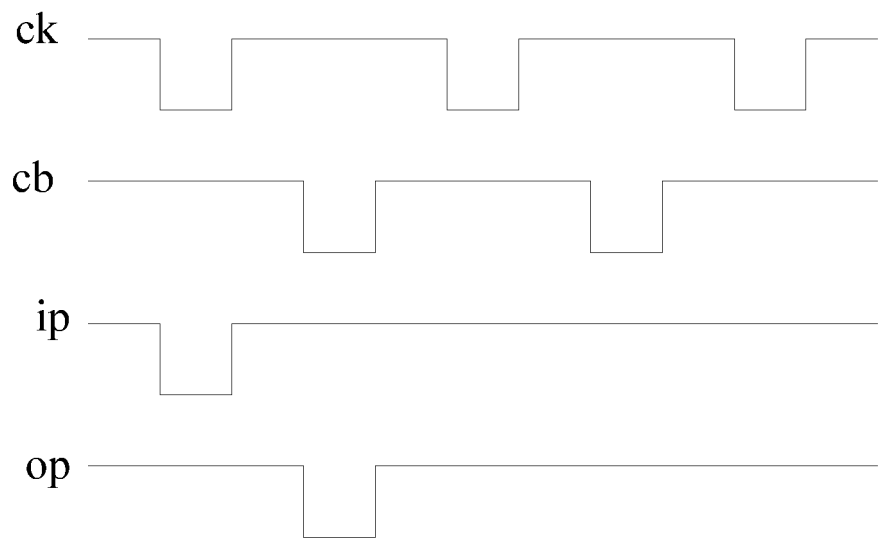
FIG. 4B is a signal sequence diagram of some shift register units provided by an embodiment of the present disclosure.
Figure 4C:
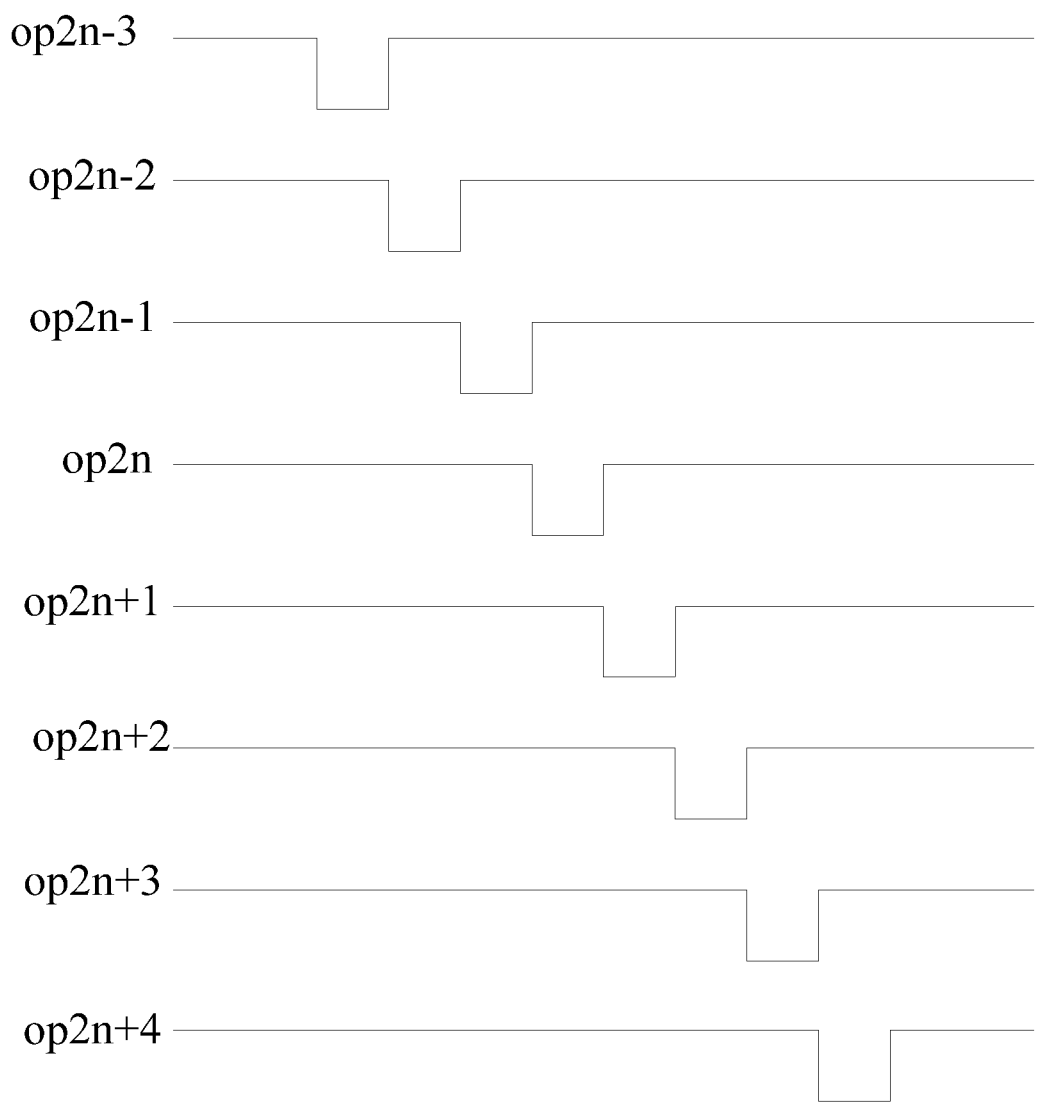
FIG. 4C is a signal sequence diagram of some gate driving circuits provided by an embodiment of the present disclosure.

Moreover, the output signal ends OP of the plurality of shift register units SR2$n$–3, SR2$n$–2, SR2$n$–1, SR2$n$, SR2$n$+1, SR2$n$+2, SR2$n$+3 and SR2$n$+4 sequentially arranged in the extension direction F1 of the clock signal lines may output signals as shown in FIG. 4C. Wherein, op2$n$–3 is a signal output by the output signal end OP of the shift register unit SR2$n$–3, op2$n$–2 is a signal output by the output signal end OP of the shift register unit SR2$n$–2, op2$n$–1 is a signal output by the output signal end OP of the shift register unit SR2$n$–1, op2$n$ is a signal output by the output signal end OP of the shift register unit SR2$n$, op2$n$+1 is a signal output by the output signal end OP of the shift register unit SR2$n$+1, op2$n$+2 is a signal output by the output signal end OP of the shift register unit SR2$n$+2, op2$n$+3 is a signal output by the output signal end OP of the shift register unit SR2$n$+3, and op2$n$+4 is a signal output by the output signal end OP the shift register unit SR2$n$+4.

During specific implementation, in the embodiment of the present disclosure, as shown in FIG. 4A, the shift register units may include: a plurality of transistors; the plurality of transistors may include: an input transistor M1, a voltage-stabilizing transistor M2, an output transistor M3, a first control transistor M4, a second control transistor M5, a sixth transistor M6, a seventh transistor M7, an eighth transistor M8, a first capacitor C01 and a second capacitor C02. A gate of the input transistor M1 is electrically connected to a first clock signal end GCK1, a first pole of the input transistor M1 is electrically connected to an input signal end IP, and a second pole of the input transistor M1 is electrically connected to a first pole of the voltage-stabilizing transistor M2. A gate of the voltage-stabilizing transistor M2 is electrically connected to a first power line VGL, a second electrode of the voltage-stabilizing transistor M2 is electrically connected to a gate of the output transistor M3, a first pole of the output transistor M3 is electrically connected to a second clock signal end GCB1, and a second pole of the output transistor M3 is electrically connected to the output signal end OP, that is, the second pole of the output transistor is correspondingly and electrically connected to the at least one scan line.

A gate of the first control transistor M4 is electrically connected to the gate of the input transistor M1, a first pole of the first control transistor M4 is electrically connected to the first power line VGL, and a second pole of the first control transistor M4 is electrically connected to a gate of the second control transistor M5. A first pole of the second control transistor M5 is electrically connected to a second power line VGH, and a second pole of the second control transistor M5 is electrically connected to the second pole of the output transistor M3.

A gate of the sixth transistor M6 is electrically connected to the second pole of the input transistor M1, a first pole of the sixth transistor M6 is electrically connected to the first clock signal end GCK1, and a second pole of the sixth transistor M6 is electrically connected to the second pole of the first control transistor M4.

A gate of the seventh transistor M7 is electrically connected to the second clock signal end GCB1, a first pole of the seventh transistor M7 is electrically connected to the second pole of the input transistor M1, and a second pole of the seventh transistor M7 is electrically connected to a first pole of the eighth transistor M8.

A gate of the eighth transistor M8 is electrically connected to the second pole of the first control transistor M4, and a second pole of the eighth transistor M8 is electrically connected to the second power line VGH.

A first pole of the first capacitor C01 is electrically connected to the second power line VGH, and a second pole of the first capacitor C01 is electrically connected to the gate of the second control transistor M5; and a first pole of the second capacitor C02 is electrically connected to the second pole of the output transistor M3, and a second pole of the second capacitor C02 is electrically connected to the gate of the output transistor M3.

A signal sequence diagram corresponding to a shift register shown in FIG. 4A is shown in FIG. 4B. Where, ck represents a clock signal input by the gate of the input transistor M1, cb represents a clock signal input by the first pole of the output transistor M3, ip represents a signal of the input signal end IP, and op represents the signal of the output signal end OP. Through cooperation of the clock signals ck and cb, the signal ip of the input signal end IP, each transistor, the first capacitor C01 and the second capacitor C02, the output transistor M3 may output the signal op. It should be noted that the signal sequence diagram corresponding to the shift register shown in FIG. 4A may further be other forms of signal sequence diagrams besides the signal sequence diagram shown in FIG. 4B, which can be designed and determined based on the needs of practical application, and is not limited in the embodiment of the present disclosure.

Exemplarily, in embodiments of the present disclosure, the specific structure of each shift register unit in the above gate driving circuit 01 may be the same as the shift register unit shown in FIG. 4A of the present disclosure in function and structure. In this way, the gate driving circuit 01 can input signals to the first scan line GA1 and the second scan line GA2, so that conduction and cutoff of the first reset transistor T6, the second reset transistor T7, the data writing transistor T2 and the threshold compensation transistor T3 may be controlled.

Figure 5A:
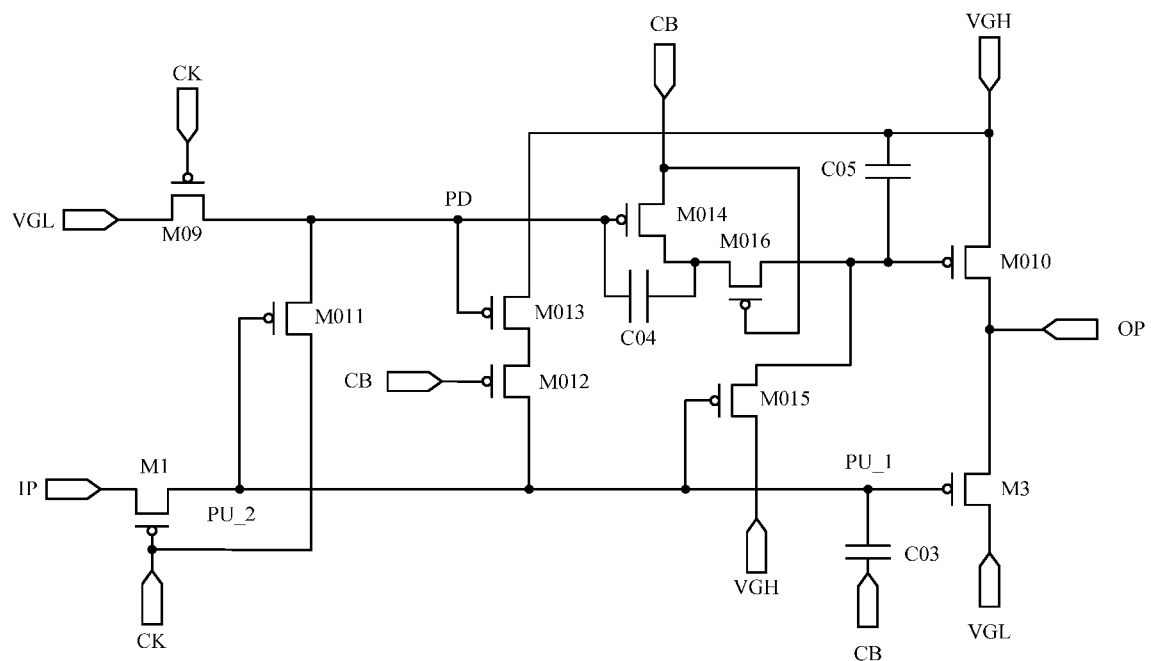
FIG. 5A is a schematic structural diagram of some other shift register units provided by an embodiment of the present disclosure.

During specific implementation, in embodiments of the present disclosure, as shown in FIG. 5A, the shift register units may include: a plurality of transistors; and the plurality of transistors may include: an input transistor M1, an output transistor M3, a ninth transistor M09, a tenth transistor M010, an eleventh transistor M011, a twelfth transistor M012, a thirteenth transistor M013, a fourteenth transistor M014, a fifteenth transistor M015, a sixteenth transistor M016, a third capacitor C03, a fourth capacitor C04 and a fifth capacitors C05.

A gate of the input transistor M1 is electrically connected to a first clock signal end CK, a first pole of the input transistor M1 is electrically connected to an input signal end IP, a second pole of the input transistor M1 is electrically connected to a gate of the output transistor M3, a first pole of the output transistor M3 is electrically connected to a first power line VGL, and a second pole of the output transistor M3 is electrically connected to an output signal end OP, that is, the second pole of the output transistor M3 is correspondingly and electrically connected to at least one light-emitting control line.

A gate of the ninth transistor M09 is electrically connected to the gate of the input transistor M1, a first pole of the ninth transistor M09 is electrically connected to the first power line VGL, and a second pole of the ninth transistor M09 is electrically connected to a gate of the fourteenth transistor M014.

A first pole of the fourteenth transistor M014 is electrically connected to a second clock signal end CB, and a second pole of the fourteenth transistor M014 is electrically connected to a first pole of the sixteenth transistor M016.

A second pole of the sixteenth transistor M016 is electrically connected to a gate of the tenth transistor M010, and a gate of the sixteenth transistor M016 is electrically connected to the second clock signal end CB.

A first pole of the tenth transistor M010 is electrically connected to a second power line VGH, and a second pole of the tenth transistor M010 is electrically connected to the second pole of the output transistor M3.

A gate of the eleventh transistor M011 is electrically connected to the second pole of the input transistor M1, a first pole of the eleventh transistor M011 is electrically connected to the first clock signal end CK, and a second pole of the eleventh transistor M011 is electrically connected to the second pole of the ninth transistor M09.

A gate of the twelfth transistor M012 is electrically connected to the second clock signal end CB, a first pole of the twelfth transistor M012 is electrically connected to the second pole of the input transistor M1, and a second pole of the twelfth transistor M012 is electrically connected to a first pole of the thirteenth transistor M013.

A gate of the thirteenth transistor M013 is electrically connected to the second pole of the ninth transistor M09, and a second pole of the thirteenth transistor M013 is electrically connected to the second power line VGH.

A first pole of the fifth capacitor C05 is electrically connected to the second power line VGH, and a second pole of the fifth capacitor C05 is electrically connected to a gate of the tenth transistor M010; and a first pole of the third capacitor C03 is electrically connected to the second clock signal end CB, and a second pole of the third capacitor C03 is electrically connected to the gate of the output transistor M3. A first pole of the fourth capacitor C04 is electrically connected to the gate of the fourteenth transistor M014, and a second pole of the fourth capacitor C04 is electrically connected to the second pole of the fourteenth transistor M014.

Figure 5B:
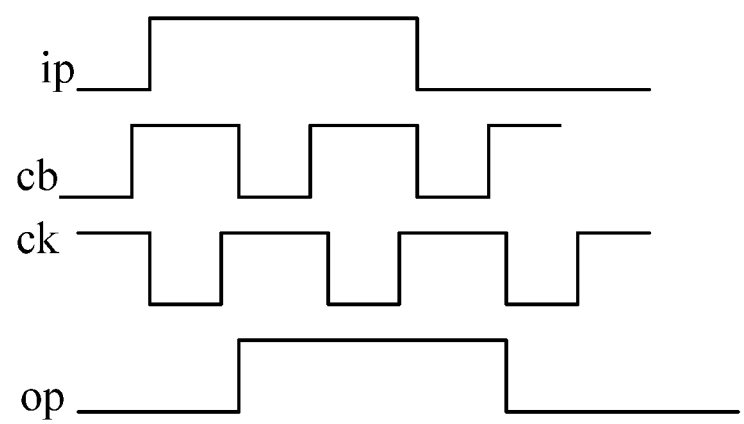
FIG. 5B is a signal sequence diagram of some other shift register units provided by an embodiment of the present disclosure.

A signal sequence diagram corresponding to a shift register shown in FIG. 5A is shown in FIG. 5B. Where, ck represents a clock signal input by the gate of the input transistor M1, cb represents a clock signal input by the gate of the twelfth transistor M012, ip represents a signal of the input signal end IP, and op represents a signal of the output signal end OP. Through cooperation of the clock signals ck and cb, the signal ip of the input signal end IP, each transistor, the first capacitor C01 and the second capacitor C02, the output transistor M3 may output the signal op. It should be noted that the signal sequence diagram corresponding to the shift register shown in FIG. 5A may further be other forms of signal sequence diagrams besides the signal sequence diagram shown in FIG. 5B, which can be designed and determined based on the needs of practical application, and is not limited in embodiments of the present disclosure.

Exemplarily, in the embodiment of the present disclosure, the specific structure of each shift register unit in the above gate driving circuit 01 may be the same as the shift register unit shown in FIG. 5A of the present disclosure in function and structure. In this way, the gate driving circuit 01 may input a signal to the light-emitting control line, so as to control conduction and cutoff of the first light-emitting control transistor T4 and the second light-emitting control transistor T5.

Of course, in practical application, the shift register unit may further be a structure including other numbers of transistors in addition to the structure shown in FIG. 4A and FIG. 5A, which is not limited in the embodiment of the present disclosure. The following description takes the structure of the shift register unit shown in FIG. 4A as an example.

In order to input the corresponding clock signal to each shift register unit, only two clock signal lines are generally used to input the corresponding clock signal to each shift register unit in the gate driving circuit 01, which causes a load of the clock signal lines to be relatively high. Especially in a large-size display panel, the quantity of shift register units is increasing, which leads to a further increase in the load of the clock signal line, in turn leads to an increase in instability of the signal output by the shift register units, thereby affecting a display effect of the display panel. Therefore, an embodiment of the present disclosure provides some display panels. Especially in the large-sized display panel, the quantity of shift register units electrically connected to each clock signal line can be reduced, thereby reducing a load of the clock signal line, improving stability of signals output by the shift register units, and improving a display effect of the display panel.

During specific implementation, in embodiments of the present disclosure, as shown in FIG. 6, the plurality of shift register units may be divided into a plurality of register unit groups GOA-m (1≤m≤M, and both m and M are integers. M is the total number of the register unit groups. FIG. 6 takes M=2 as an example). All the shift register units in the same register unit group GOA-m are cascaded, and the two shift register units adjacent in an extension direction of the clock signal lines are located in different register unit groups. For example, at least one remaining scan line is disposed between scan lines that are electrically connected between every two adjacent shift register units in each register unit group GOA-m. That is to say, the shift register units in the different register unit groups are arranged alternately.

Moreover, during specific implementation, in embodiments of the present disclosure, as shown in FIG. 6, the plurality of clock signal lines may be divided into a plurality of clock signal line groups GC-m, and the different register unit groups correspond to the different clock signal line groups, that is, one register unit group GOA-m is correspondingly and electrically connected to one clock signal line group GC-m. Exemplarily, the gate of the input transistor M1 is electrically connected to one clock signal line in the corresponding clock signal line group, the first pole of the input transistor M1 is electrically connected to the input signal end IP, and the second pole of the input transistor M1 is electrically connected to the first pole of the voltage-stabilizing transistor M2; the second pole of the voltage-stabilizing transistor M2 is electrically connected to a gate of the output transistor M3; and the first pole of the output transistor M3 is electrically connected to another clock signal line in the corresponding clock signal line group, and the second pole of the output transistor M3 is correspondingly and electrically connected to at least one scan line.

In some embodiments of the present disclosure, by grouping the shift register units, and making one register unit group correspond to one clock signal line group, the corresponding clock signal is loaded to the corresponding register unit group through the clock signal line group. In this way, the quantity of the shift register units electrically connected to one clock signal line can be reduced, thereby reducing the load of the clock signal line, improving the stability of the signal output by the shift register units, and improving the display effect of the display panel.

During specific implementation, when the structure of the shift register units is shown in FIG. 4A, one shift register unit may be electrically connected to the two clock signal lines. In the embodiment of the present disclosure, as shown in FIG. 6, the plurality of shift register units in the gate driving circuit 01 may be divided into the two register unit groups. The plurality of clock signal lines is divided into the two clock signal line groups. Of course, the plurality of shift register units in the gate driving circuit 01 may also be divided into 3, 4, 5, 6 or more register unit groups, and the plurality of clock signal lines may be divided into 3, 4, 5, 6 or more clock signal line groups, which are not limited here.

Exemplarily, when M=2, as shown in FIG. 6, the above two register unit groups may include a first register unit group GOA-1 and a second register unit group GOA-2. The above two clock signal line groups include a first clock signal line group GC-1 and a second clock signal line group GC-2. The first register unit group GOA-1 is electrically connected to the first clock signal line group GC-1, and the second register unit group GOA-2 is electrically connected to the second clock signal line group GC-2.

Exemplarily, when M=2, as shown in FIG. 6, the first register unit group GOA-1 may include odd-numbered shift register units sequentially arranged in an extension direction F1 of the clock signal lines. The first clock signal line group GC-1 includes a first clock signal line GCK1 and a second clock signal line GCB1. The shift register units in the first register unit group GOA-1 are cascaded. For example, in the first register unit group GOA-1, an input signal end of the first level of shift register unit is electrically connected to a first frame of trigger signal end, and an output signal end of the previous level of shift register unit in every two adjacent levels of shift register units is electrically connected to an input signal end of the next level of shift register unit. For example, the first register unit group GOA-1 may include shift register units SR2n−3, SR2n−1, SR2n+1, SR2n+3, and so on. Where, an output signal end of the shift register unit SR2n−3 is electrically connected to an input signal end of the shift register unit SR2n−1, an output signal end of the shift register unit SR2n−1 is electrically connected to an input signal end of the shift register unit SR2n+1, and an output signal end of the shift register unit SR2n+1 is electrically connected to an input signal end of the shift register unit SR2n+3.

Moreover, for the plurality of shift register units cascaded in the first register unit group GOA-1, gates of the input transistors of the odd-numbered level of shift register units and first poles of the output transistors of the even-numbered level of shift register units are all electrically connected to the first clock signal line GCK1. And first poles of the output transistors of the odd-numbered level of shift register units and gates of the input transistors of the even-numbered level of shift register units are all electrically connected to the second clock signal line GCB1. or, the gates of the input transistors of the odd-numbered level of shift register units are electrically connected to the first clock signal line through a corresponding first connection line, and the first poles of the output transistors of the odd-numbered level of shift register units are electrically connected to the first power line through a corresponding second connection line; and, the gates of the input transistors of the even-numbered level of shift register units are electrically connected to the second clock signal line through the corresponding first connection line, and the first poles of the output transistors of the even-numbered level of shift register units are electrically connected to the first power line through the corresponding second connection line.

Exemplarily, when M=2, as shown in FIG. 6, the second register unit group GOA-2 may include even-numbered shift register units sequentially arranged in the extension direction of the clock signal lines. The second clock signal line group GC-2 includes a third clock signal line GCK2 and a fourth clock signal line GCB2. The shift register units in the second register unit group GOA-2 are cascaded. For example, in the second register unit group GOA-2, an input signal end of the first level of shift register unit is electrically connected to a second frame of trigger signal end, and an output signal end of the previous level of shift register unit in every two adjacent levels of shift register units is electrically connected to an input signal end of the next level of shift register unit. For example, the second register unit group GOA-2 may include shift register units SR2n−2, SR2n, SR2n+2, SR2n+4, and so on. Wherein, an output signal end of the shift register unit SR2n−2 is electrically connected to an input signal end of the shift register unit SR2n, an output signal end of the shift register unit SR2n is electrically connected to an input signal end of the shift register unit SR2n+2, and an output signal end of the shift register unit SR2n+2 is electrically connected to an input signal end of the shift register unit SR2n+4.

Moreover, for the plurality of shift register units cascaded in the second register unit group GOA-2, gates of the input transistors of the odd-numbered level of shift register units and first poles of the output transistors of the even-numbered level of shift register units are all electrically connected to the third lock signal line GCK2. And first poles of the output transistors of the odd-numbered level of shift register units and gates of the input transistors of the even-numbered level of shift register units are all electrically connected to the fourth clock signal line GCB2. or, the gates of the input transistors of the odd-numbered level of shift register units are electrically connected to the third clock signal line through a corresponding first connection line, and the first poles of the output transistors of the odd-numbered level of shift register units are electrically connected to the first power line through a corresponding second connection line; and, the gates of the input transistors of the even-numbered level of shift register units are electrically connected to the fourth clock signal line through the corresponding first connection line, and the first poles of the output transistors of the even-numbered level of shift register units are electrically connected to the first power line through the corresponding second connection line.

FIG. 6 is a schematic diagram of a layout structure of a gate driving circuit 01 provided by some embodiments of the present disclosure. FIG. 7A-FIG. 7D are schematic diagrams of all layers of the gate driving circuit 01 provided by some embodiments of the present disclosure. FIG. 8A is a schematic diagram of a sectional structure along a direction AA' of the schematic diagram of the layout structure of the gate driving circuit 01 shown in FIG. 6. FIG. 8B is a schematic diagram of a sectional structure along a direction BB' of the schematic diagram of the layout structure of the gate driving circuit 01 shown in FIG. 6. The examples shown in FIG. 6 to FIG. 7D take the shift register units SR2$n$−3, SR2$n$−1, SR2$n$+1 and SR2$n$+3 included in the first register unit group GOA-1, and the shift register units SR2$n$−2, SR2$n$, SR2$n$+2 and SR2$n$+4 included in the second register unit group GOA-2 are taken as examples.

Exemplarily, as shown in FIG. 6, FIG. 7a, FIG. 8A and FIG. 8B, a semiconductor layer 500 of the gate driving circuit 01 is shown. The semiconductor layer 500 may be formed by patterning a semiconductor material. The semiconductor layer 500 may be used to manufacture active layers of the above plurality of transistors, for example, to prepare the active layers of the input transistor to the eighth transistor M1-M8. Each active layer may include a source region, a drain region, and a channel region located between the source region and the drain region. For example, the active layers include a channel region M1-A of the input transistor M1, a channel region M2-A of the voltage-stabilizing transistor M2, a channel region M3-A of the output transistor M3, a channel region M4-A of the first control transistor M4, a channel region M5-A of the second control transistor M5, a channel region M6-A of the sixth transistor M6, a channel region M7-A of the seventh transistor M7, and a channel region M8-A of the eighth transistor M8. Rectangular dashed boxes in FIG. 7A mark the channel regions of the above transistors.

Figure 7A:
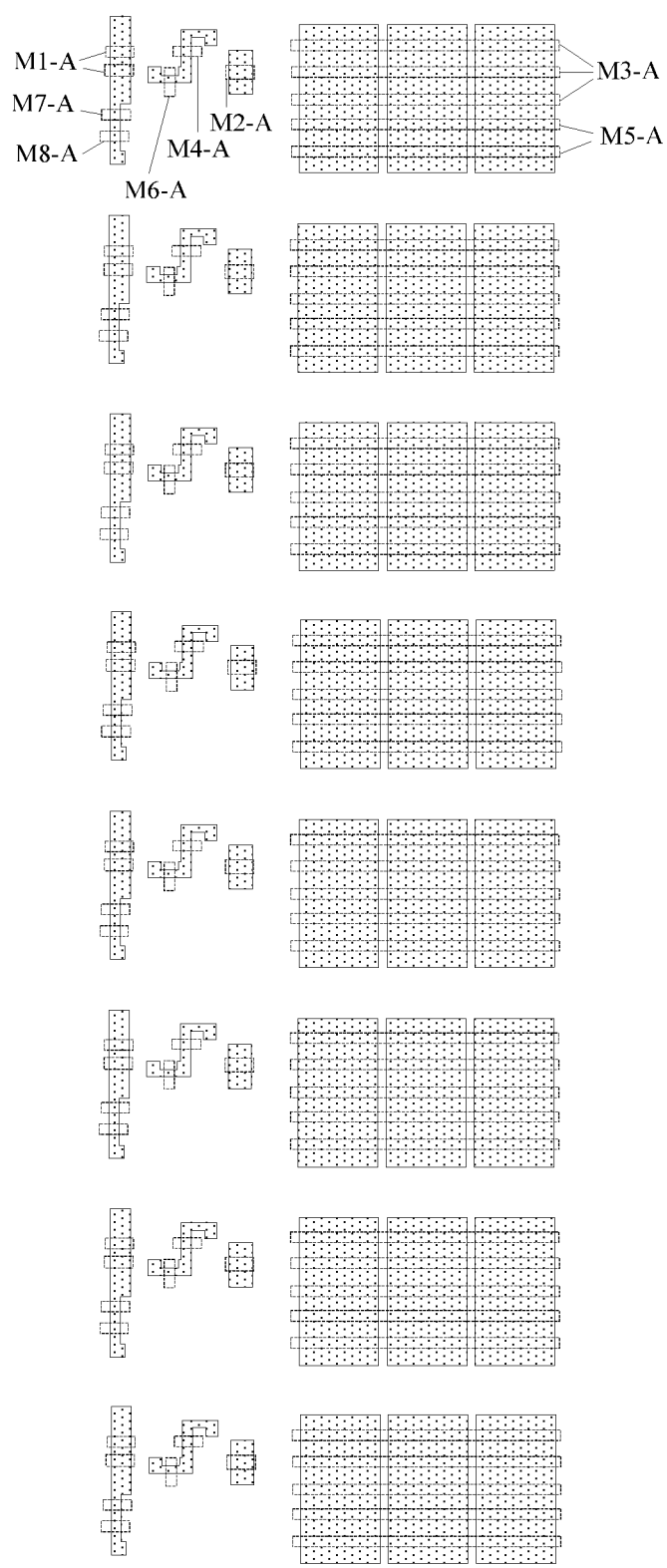
FIG. 7A is a schematic diagram of a layout structure of some semiconductor layers provided by an embodiment of the present disclosure.
Figure 7B:
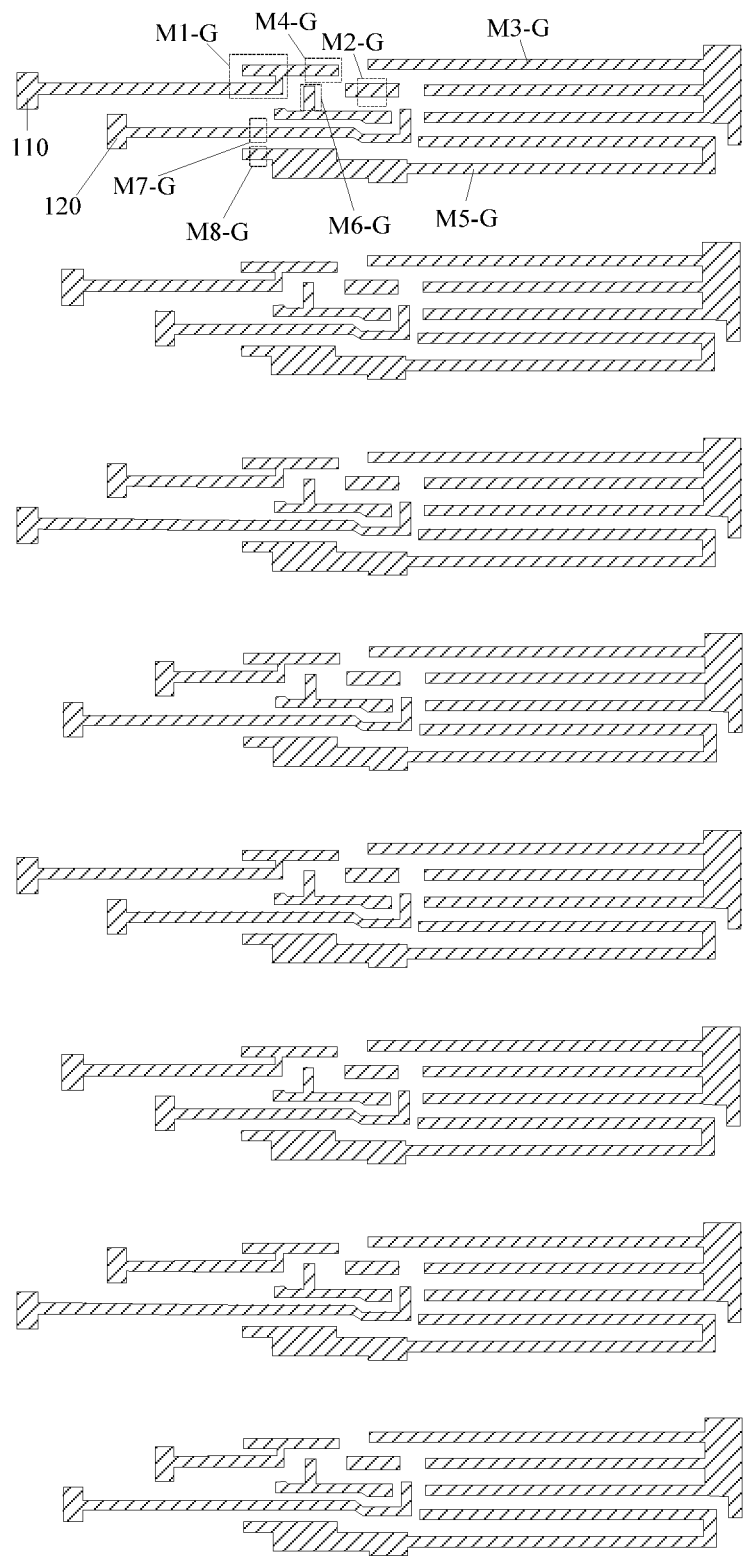
FIG. 7B is a schematic diagram of a layout structure of some gate conductive layers provided by an embodiment of the present disclosure.
Figure 7C:
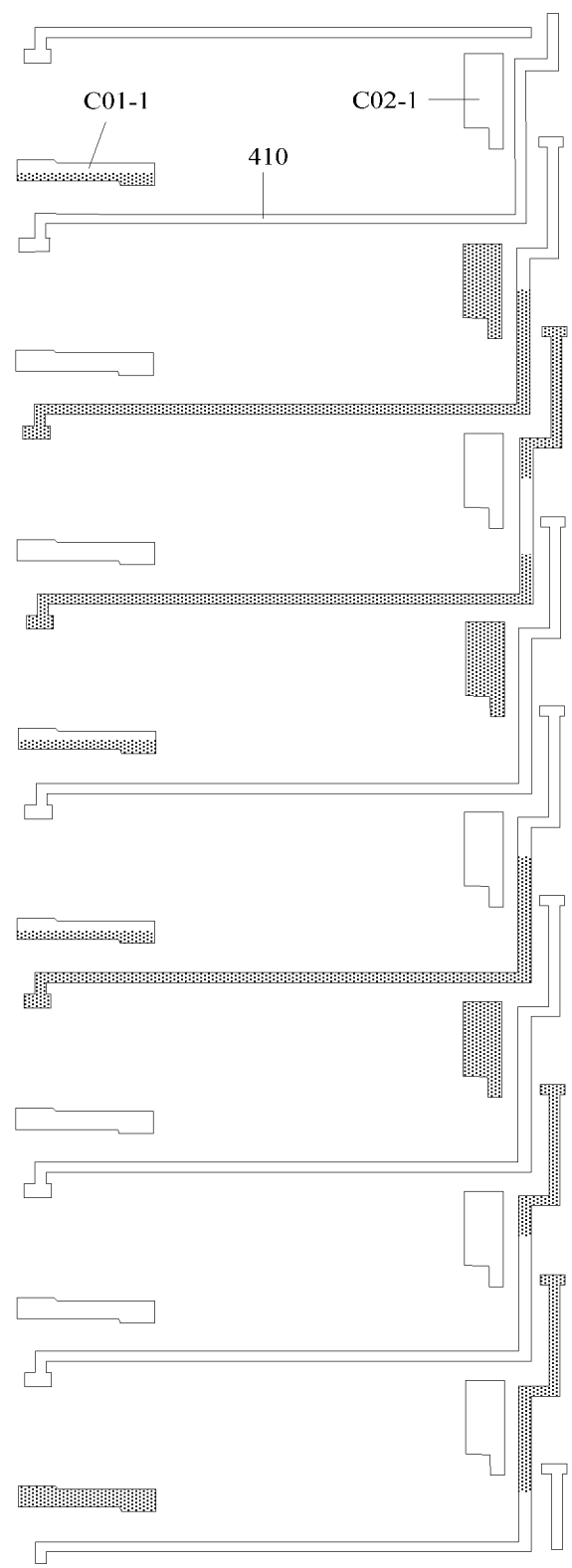
FIG. 7C is a schematic diagram of a layout structure of some fourth conductive layers provided by an embodiment of the present disclosure.
Figure 7D:
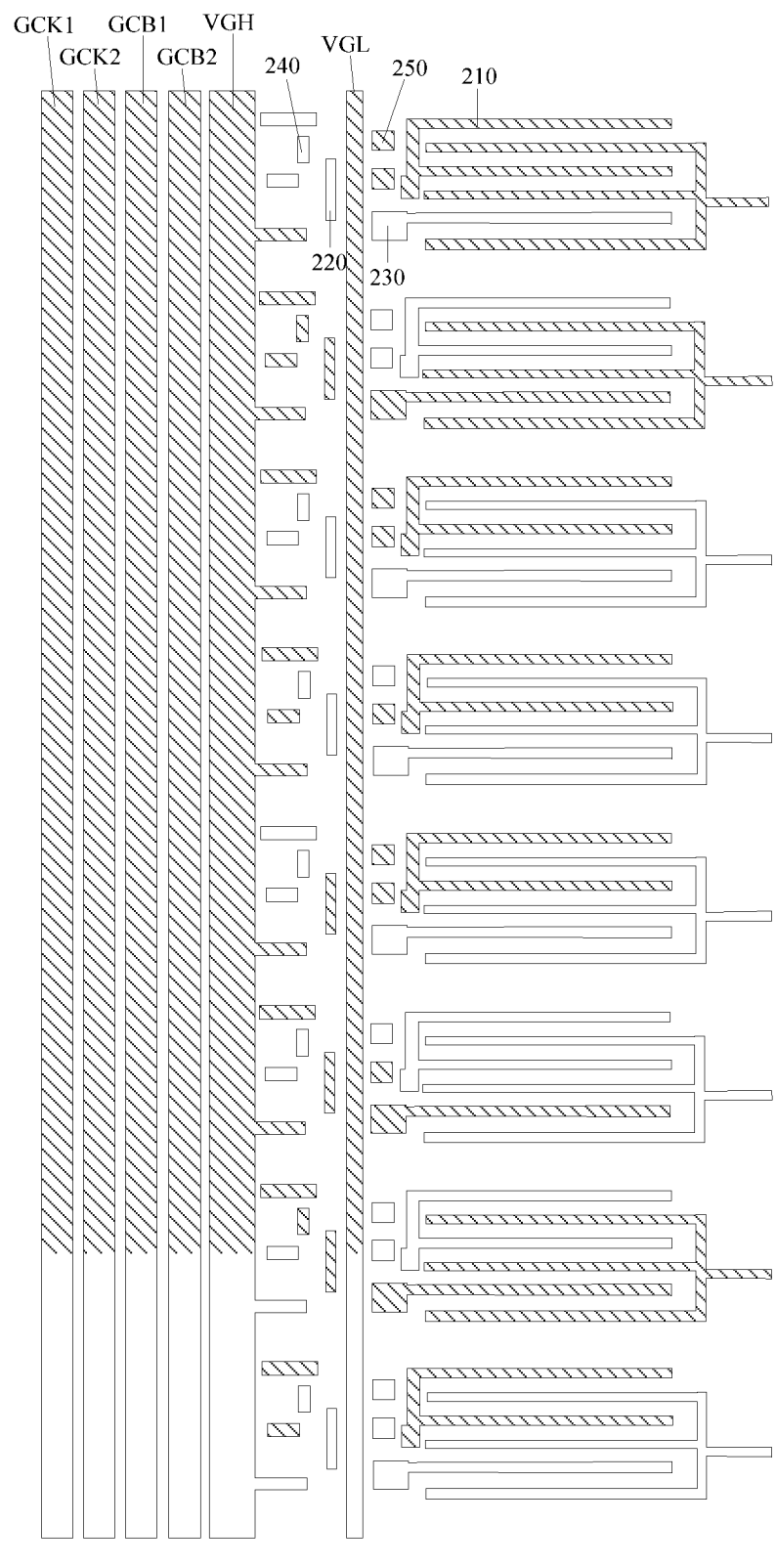
FIG. 7D is a schematic diagram of a layout structure of some second conductive layers provided by an embodiment of the present disclosure.
Figure 8A:
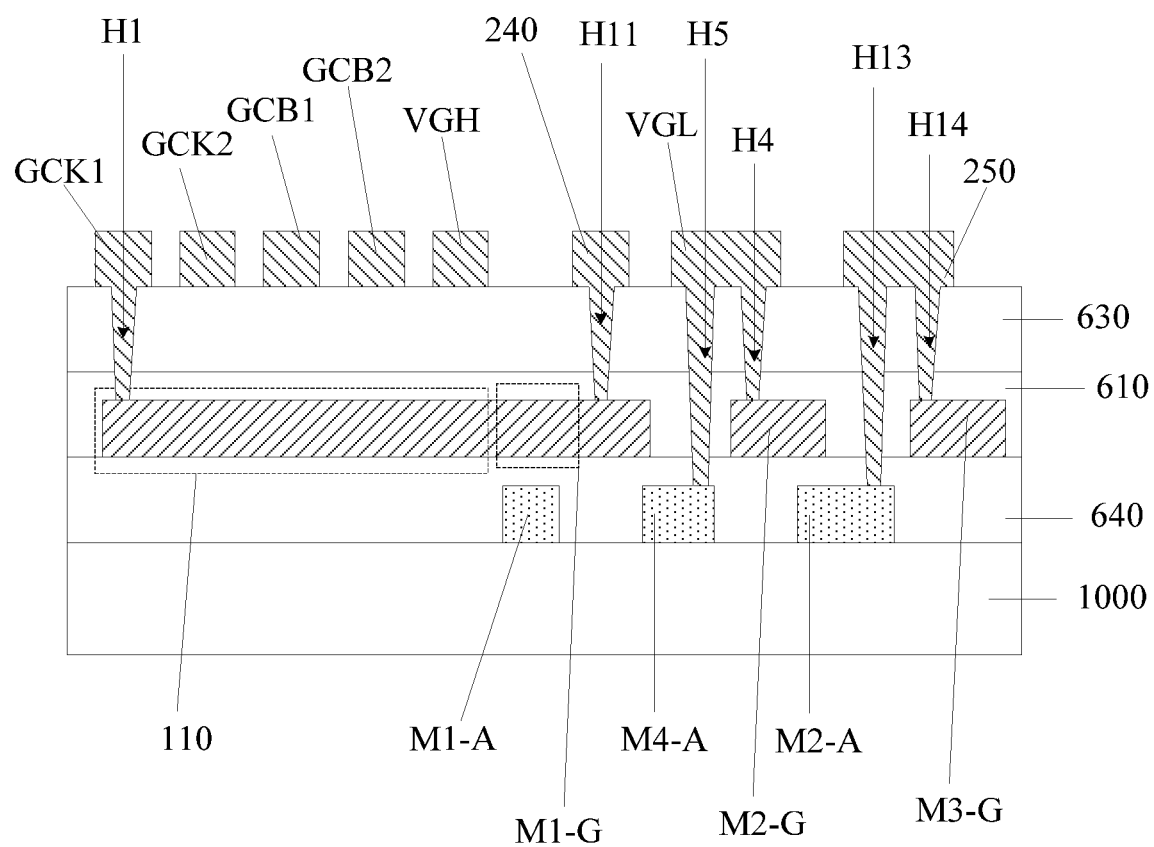
FIG. 8A is a schematic diagram of a sectional structure along a direction AA' in the schematic diagram of the layout structure shown in FIG. 6.
Figure 8B:
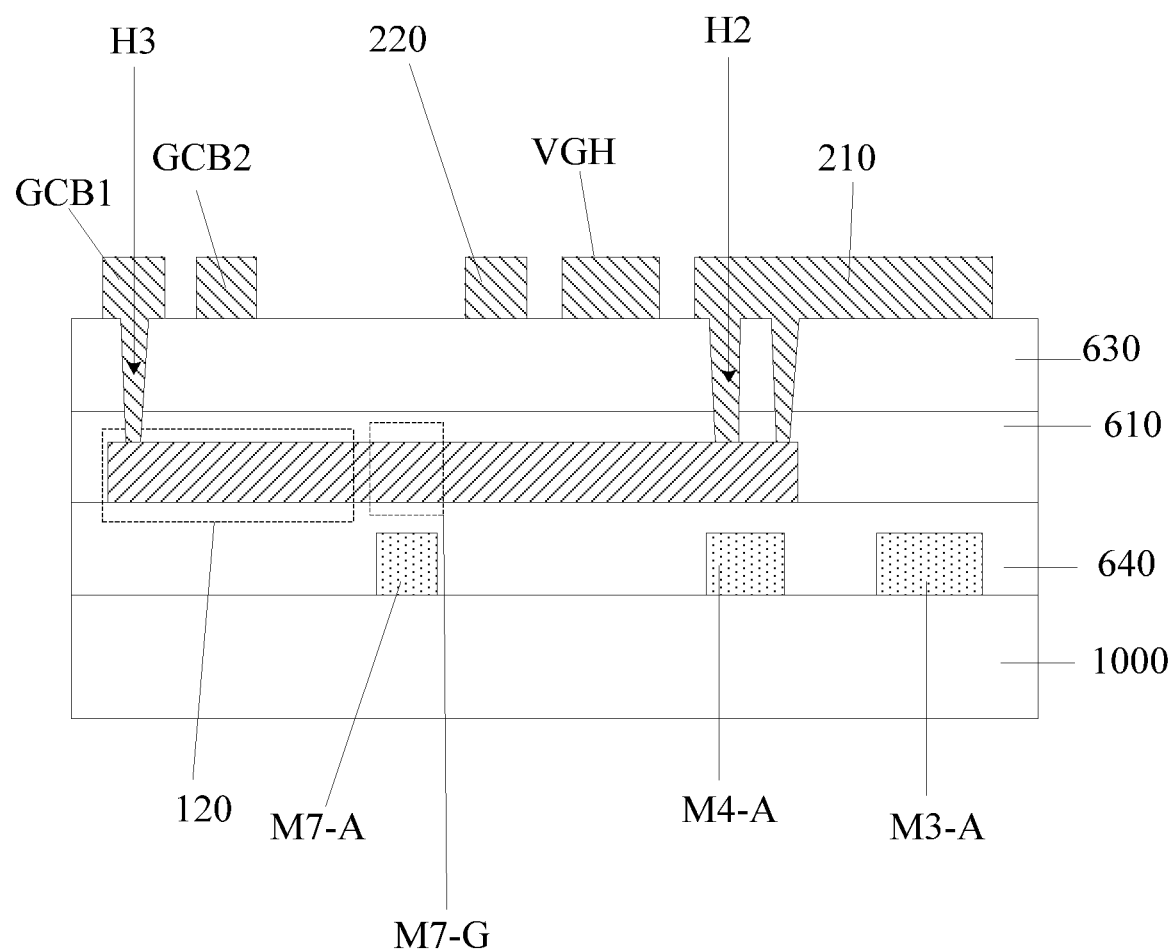
FIG. 8B is a schematic diagram of a sectional structure along a direction BB' in the schematic diagram of the layout structure shown in FIG. 6.

In some embodiments, as shown in FIG. 6 and FIG. 7A, in the same shift register unit, the active layer of the output transistor and the active layer of the second control transistor may be disposed in an integrated structure.

Moreover, it should be noted that the semiconductor layer 500 is further used to manufacture active layers of a driving transistor T1, a data writing transistor T2, a threshold compensation transistor T3, a first light-emitting control transistor T4, a second light-emitting control transistor T5, a first reset transistor T6 and a second reset transistor T7 in the above pixel driving circuit.

Moreover, exemplarily, the semiconductor layer 500 may be manufactured by adopting amorphous silicon, polysilicon, oxide semiconductor materials, or the like. It should be noted that the above source region and drain region may be conductive regions formed by doping with n-type impurities or p-type impurities.

Exemplarily, as shown in FIG. 8A and FIG. 8B, a gate insulating layer 640 is formed on the above semiconductor layer 500 to protect the above semiconductor layer 500. As shown in FIG. 6, FIG. 7B, FIG. 8A and FIG. 8B, a first conductive layer 100 of the gate driving circuit 01 is shown. The first conductive layer 100 is disposed on one side of the gate insulating layer 640 facing away from a base substrate 1000 so as to be insulated from the semiconductor layer 500. The first conductive layer 100 may include: a plurality of scan lines, gates of the above plurality of transistors, a plurality of first connection lines 110 and a plurality of second connection lines 120. For example, the first conductive layer includes the gate M1-G of the input transistor M1, the gate M2-G of the voltage-stabilizing transistor M2, the gate M3-G of the output transistor M3, the gate M4-G of the first control transistor M4, the gate M5-G of the second control transistor M5, the gate M6-G of the sixth transistor M6, the gate M7-G of the seventh transistor M7, and the gate M8-G of the eighth transistor M8. Moreover, it should be noted that the first conductive layer 100 may further include: the gates of the driving transistor T1, the data writing transistor T2, the threshold compensation transistor T3, the first light-emitting control transistor T4, the second light-emitting control transistor T5, the first reset transistor T6 and the second reset transistor T7 in the pixel driving circuit. The first conductive layer 100 may further include: a light-emitting control line EM and the like. It should be noted that an overlapped part of an orthographic projection of the first conductive layer 100 on the base substrate 1000 and an orthographic projection of the channel region in the semiconductor layer 500 on the base substrate 1000 are set as the gates of the above transistors.

In some embodiments, one shift register unit corresponds to at least one first connection line 110 and at least one second connection line 120. For one shift register unit and the clock signal line group corresponding to the shift register unit, one end of the first connection line 110 is directly electrically connected to the gate of the input transistor in the shift register unit, and the other end of the first connection line 110 is electrically connected to one clock signal line in the clock signal line group through a first via hole H1. One end of the second connection line is electrically connected to a first transfer part through a second via hole, and the other end of the second connection line is electrically connected to another clock signal line in the clock signal line group or the first power line through a third via hole. For example, in the first register unit group GOA-1, the gates of the input transistors of the odd-numbered level of shift register units are electrically connected to the first clock signal line GCK1 through the corresponding first connection line 110, and the gates of the input transistors of the even-numbered level of shift register units are electrically connected to the second clock signal line GCB1 through the corresponding first connection line 110. Moreover, in the second register unit group GOA-2, the gates of the input transistors of the odd-numbered level of shift register units are electrically connected to the third clock signal line GCK2 through the corresponding first connection line 110, and the gates of the input transistors of the even-numbered level of shift register units are electrically connected to the fourth clock signal line GCB2 through the corresponding first connection line 110.

Moreover, for one shift register unit, the gate of the first control transistor in the shift register unit is directly electrically connected to the corresponding first connection line 110, so that the gate of the first control transistor and the gate of the input transistor may be disposed as an integrated structure.

Exemplarily, as shown in FIG. 8A and FIG. 8B, a first insulating layer 610 is formed on the above first conductive layer 100 to protect the above first conductive layer 100. As shown in FIG. 6, FIG. 7C, FIG. 8A and FIG. 8B, a fourth conductive layer 400 of the gate driving circuit 01 is shown. The fourth conductive layer 400 is disposed on one side of the first insulating layer 610 facing away from the base substrate 1000. The fourth conductive layer 400 may include: a plurality of first conductive parts C01-1, a plurality of second conductive parts C02-1, and a plurality of third conductive parts 410. One first conductive part C01-1 and one second conductive portion C02-1 are disposed in one shift register. That is, one first conductive part C01-1 corresponds to one second control transistor M5, and one second conductive part C02-1 corresponds to one output transistor M3.

Exemplarily, an orthographic projection of each first conductive part C01-1 on the base substrate and an orthographic projection of the gate M5-G of the corresponding second control transistor M5 on the base substrate have an overlapped region, thereby forming a first capacitor C01. The first conductive parts C01-1 serve as first poles C01-1 of the first capacitors C01, and the gates M5-G of the second control transistors M5 serve as second poles of the first capacitors C01.

In some embodiments, an orthographic projection of each second conductive part C02-1 on the base substrate and an orthographic projection of the gate M3-G of the corresponding output transistor M3 on the base substrate have an overlapped region, thereby forming a second capacitor C02. The second conductive parts C02-1 serve as first poles of the second capacitors C02. The gates M3-G of the output transistors M3 serve as second poles of the second capacitors C02.

In some embodiments, the two cascaded shift register units may be electrically connected through one third conductive part 410. For example, in the two cascaded shift register units, the first pole of the output transistor in the previous level of shift register unit is electrically connected to the first pole of the input transistor in the next level of shift register unit through the third conductive part 410.

In some embodiments, the orthographic projections of the gates of the second control transistors on the base substrate may be made to cover the orthographic projections of the first conductive parts on the base substrate.

It should be noted that the fourth conductive layer 400 may further include a first pole of a storage capacitor CST in the above pixel driving circuit and a reset signal line.

Exemplarily, as shown in FIG. 8A and FIG. 8B, a third insulating layer 630 is formed on the above fourth conductive layer 400 to protect the above fourth conductive layer 400. As shown in FIG. 6, FIG. 7D, FIG. 8A and FIG. 8B, a second conductive layer 200 of the gate driving circuit 01 is shown, and the second conductive layer 200 is disposed on one side of the third insulating layer 630 facing away from the base substrate 1000. The second conductive layer 200 may include: a plurality of data lines VD, the first power line VGL, the second power line VGH, the plurality of clock signal lines (e.g., the first clock signal line GCK1, the second clock signal line GCB1, the third clock signal line GCK2, and the fourth clock signal line GCB2), a plurality of first transfer parts 210, a plurality of second transfer parts 220, a plurality of third transfer parts 230, a plurality of fourth transfer parts 240, and a plurality of fifth transfer parts 250. One first transfer part 210, one second transfer part 220, one third transfer part 230, one fourth transfer part 240, and one fifth transfer part 250 are disposed in one shift register.

In some embodiments, as shown in FIG. 6 and FIG. 8B, one first transfer part 210 is disposed corresponding to one output transistor, and one first transfer part 210 is electrically connected to a source region of the active layer of one output transistor through a tenth via hole. Moreover, one end of the second connection line 120 is electrically connected to the first transfer part 210 through a second via hole H2, and the other end of the second connection line 120 is electrically connected to the clock signal line through a third via hole H3.

In some embodiments, as shown in FIG. 6, one second transfer part 220 is disposed corresponding to one first control transistor, and a drain region of the active layer of the first control transistor is electrically connected to the gate of the second control transistor through the corresponding second transfer part 220.

In some embodiments, as shown in FIG. 6 and FIG. 8a, one third transfer part 230 corresponds to one second control transistor. A source region of the active layer of each second control transistor is electrically connected to one end of the corresponding third transfer part 230 through a sixth via hole H6, the other end of the third transfer part 230 is electrically connected to one end of the corresponding first conductive part through a seventh via hole H7, the other end of the first conductive part is electrically connected to the second power line through an eighth via hole H8, and the drain region of the active layer of the second control transistor is shared with a drain region of the active layer of the output transistor.

In some embodiments, as shown in FIG. 6 and FIG. 8a, one fourth transfer part 240 corresponds to one sixth transistor M6. One end of the fourth transfer part 240 is electrically connected to the gate M1-G of the input transistor M1 through an eleventh via hole H11, and the other end of the fourth transfer part 240 is electrically connected to the source region of the active layer of the sixth transistor M6 through a twelfth through hole.

In some embodiments, as shown in FIG. 6 and FIG. 8a, one fifth transfer part 250 corresponds to one voltage-stabilizing transistor M2. One end of the fifth transfer part 250 is electrically connected to a drain region of the active layer of the voltage-stabilizing transistor M2 through a thirteenth via hole H13, and the other end of the fifth transfer part 250 is electrically connected to the gate of the output transistor M3 through a fourteenth via hole H14.

It should be noted that an electrical connection relationship between other transistors can be achieved by using other transfer parts, which is not repeated here.

In some embodiments, as shown in FIG. 6, in the first register unit group GOA-1, the first poles of the output transistors of the odd-numbered level of shift register units (e.g., the source regions of the active layers of the output transistors) are electrically connected to the second clock signal lines GCB1 through the corresponding second connection lines 120, and the first poles of the output transistors of the even-numbered level of shift register units (e.g., the source regions of the active layers of the output transistors) are electrically connected to the first clock signal lines GCK1 through the corresponding second connection lines 120. Moreover, in the second register unit group GOA-2, the first poles of the output transistors of the odd-numbered level of shift register units (e.g., the source regions of the active layers of the output transistors) are electrically connected to the fourth clock signal lines GCB2 through the corresponding second connection lines 120, and the first poles of the output transistors of the even-numbered level of shift register units are electrically connected to the third clock signal lines GCK2 through the corresponding second connection lines 120.

In some embodiments, as shown in FIG. 6, FIG. 8A and FIG. 8B, the gate of each voltage-stabilizing transistor is electrically connected to the first power line through the fourth via hole H4, so as to input the corresponding voltage signal to the gate of the voltage-stabilizing transistor.

In some embodiments, as shown in FIG. 6, FIG. 8A and FIG. 8B, in the same gate driving circuit 01, an orthographic projection of the input transistor on the base substrate is located between an orthographic projection of the first power line on the base substrate and orthographic projections of the plurality of clock signal lines on the base substrate. An orthographic projection of the voltage-stabilizing transistor on the base substrate is located on one side of the orthographic projection of the first power line on the base substrate facing away from the orthographic projections of the plurality of clock signal lines on the base substrate. An orthographic projection of the output transistor on the base substrate is located on one side of the orthographic projection of the voltage-stabilizing transistor on the base substrate facing away from the orthographic projection of the first power line on the base substrate.

In some embodiments, as shown in FIG. 6, FIG. 8A and FIG. 8B, the source region of the active layer of the first control transistor is electrically connected to the first power line through the fifth via hole H5, so that a corresponding voltage signal may be input to the source region of the active layer of the first control transistor.

In some embodiments, as shown in FIG. 6, an orthographic projection of the second power line on the base substrate is located between the orthographic projections of the plurality of clock signal lines on the base substrate and an orthographic projection of the gate driving circuit 01 on the base substrate. Moreover, in each shift register unit, an orthographic projection of the first control transistor on the base substrate is located between the orthographic projection of the input transistor on the base substrate and the orthographic projection of the first power line on the base substrate. In each shift register unit, an orthographic projection of the second control transistor on the base substrate is located on one side of the orthographic projection of the input transistor on the base substrate facing away from the orthographic projection of the first power line on the base substrate.

In some embodiments, as shown in FIG. 6, the orthographic projections of the gates of the second control transistors on the base substrate and the orthographic projections of the first conductive parts on the base substrate respectively have overlapped regions with the orthographic projections of the first power lines on the base substrate.

In some embodiments, as shown in FIG. 6, an orthographic projection of the eighth via hole H8 on the base substrate is located between the orthographic projections of the first power lines on the base substrate and the orthographic projections of the second power lines on the base substrate, and an orthographic projection of the seventh via hole H7 on the base substrate is located between the orthographic projections of the first power lines on the base substrate and the orthographic projections of the active layers of the second control transistors on the base substrate.

As shown in FIG. 8A and FIG. 8B, the gate insulating layer 640 is disposed between the semiconductor layer 500 and the first conductive layer 100, the first insulating layer 610 is disposed between the first conductive layer 100 and the fourth conductive layer 400, the third insulating layer 630 is disposed between the fourth conductive layer 400 and the second conductive layer 200, and the second insulating layer 620 is disposed between the second conductive layer 200 and the third conductive layer 300. All the above via holes are formed at intervals. Moreover, the first via hole H1, the second via hole H2, the third via hole H3, the fourth via hole H4, the eleventh via hole H11 and the fourteenth via hole H14 penetrate through the first insulating layer and the third insulating layer. The fifth via hole H5, the sixth via hole H6, the twelfth via hole and the thirteenth via hole H13 penetrate through the first insulating layer, the third insulating layer and the gate insulating layer. The seventh via hole H7 and the eighth via hole H8 penetrate through the third insulating layer.

Figure 9:
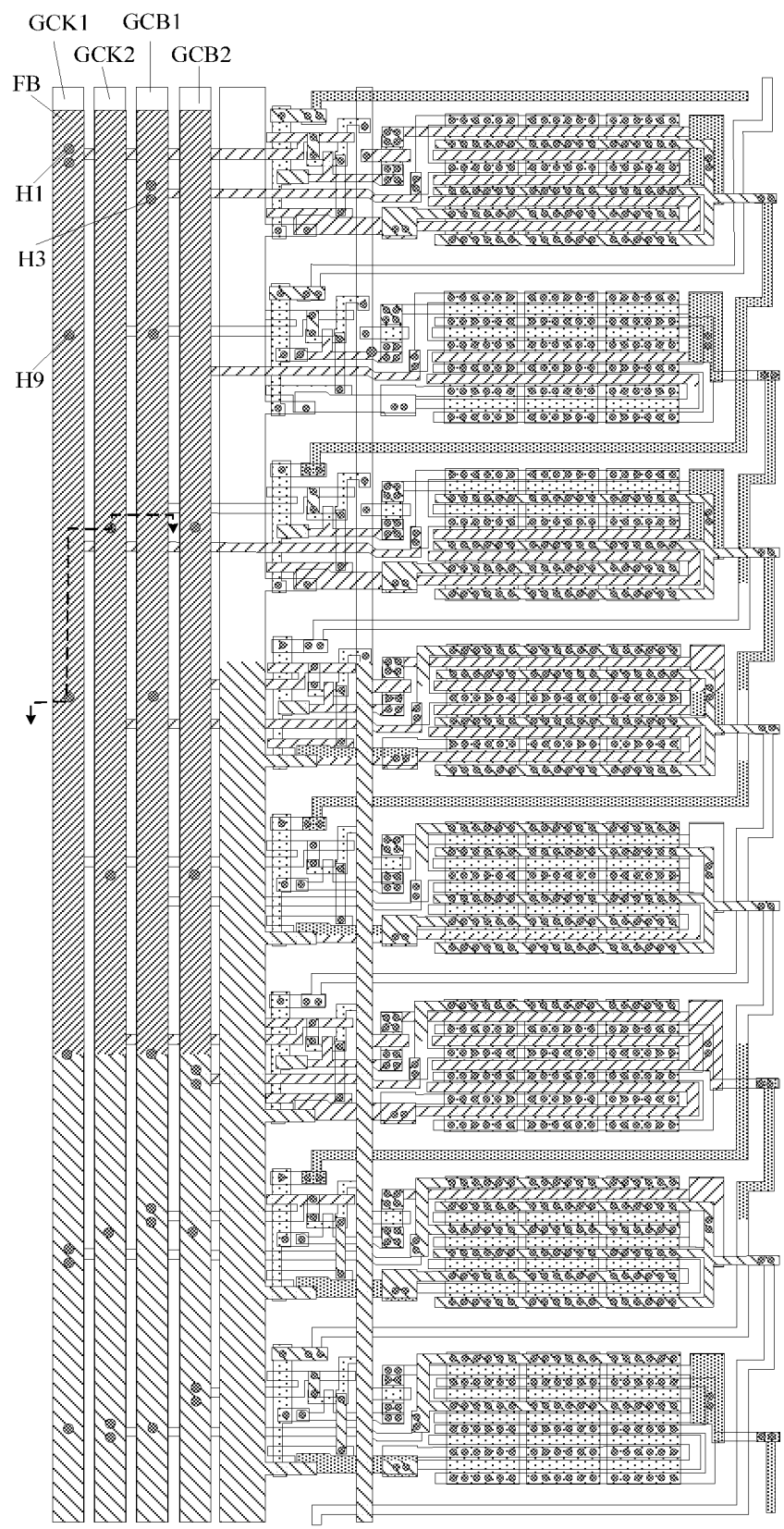
FIG. 9 is a schematic diagram of a layout structure of some other gate driving circuits provided by an embodiment of the present disclosure.

Schematic structural diagrams of some other display panels provided by embodiments of the present disclosure, as shown in FIG. 9, are modified for the implementations of the above embodiments. Only the differences between the present embodiment and the above embodiments are described below, and the similarities are not repeated here.

Figure 10:
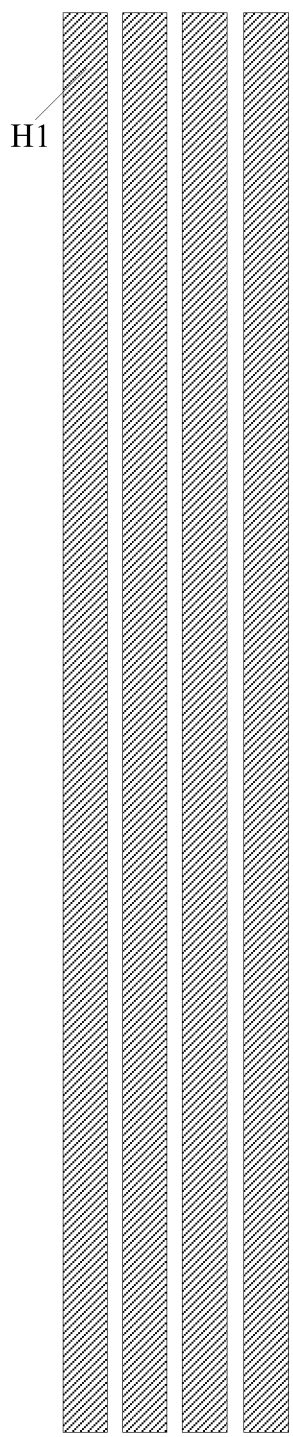
FIG. 10 is a schematic diagram of a layout structure of some third conductive layers provided by an embodiment of the present disclosure.
Figure 11:
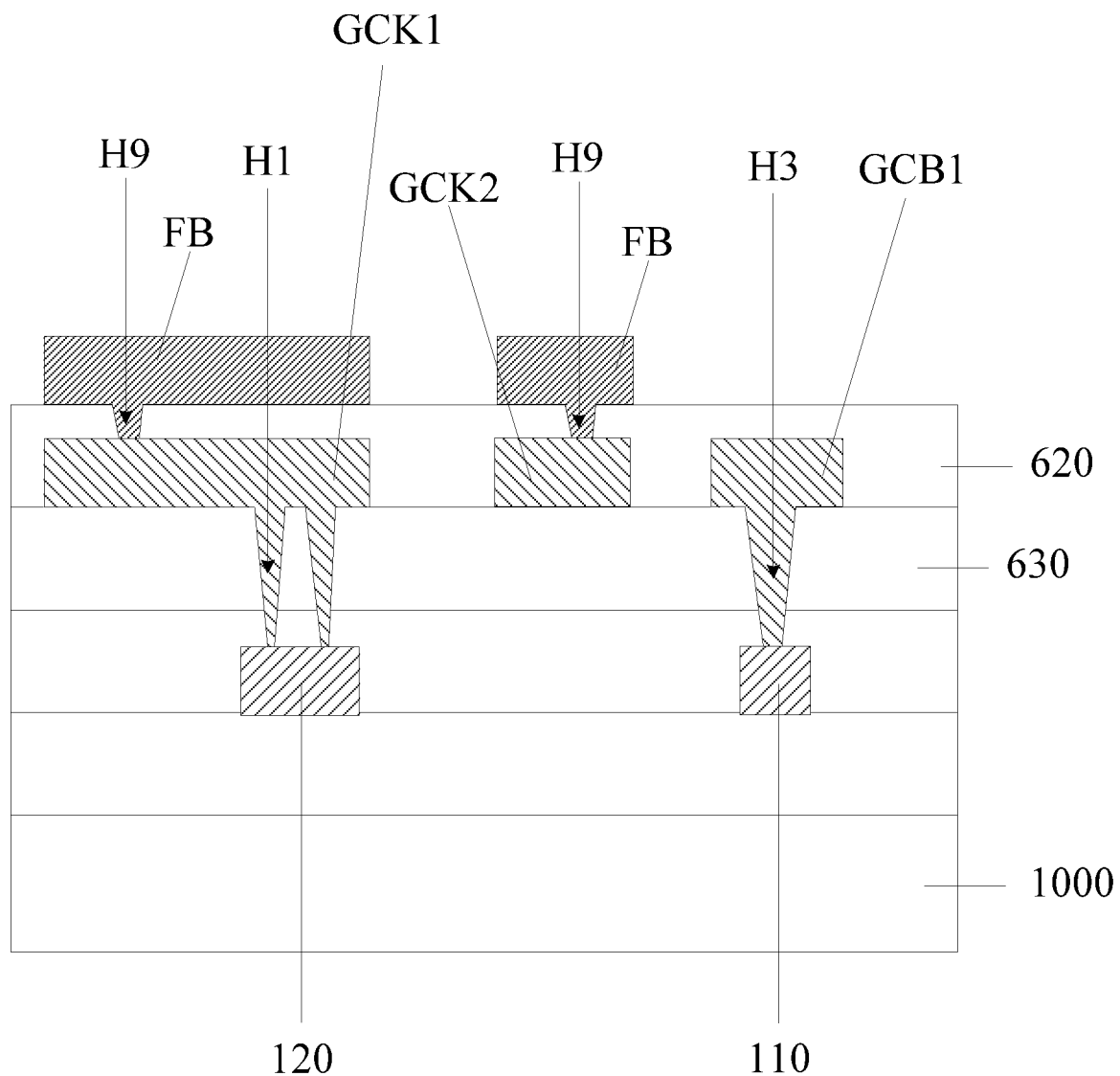
FIG. 11 is a schematic diagram of a sectional structure along a direction AA' in the schematic diagram of the layout structure shown in FIG. 9.

Exemplarily, as shown in FIG. 9 to FIG. 11, a second insulating layer 620 is formed on the above fourth conductive layer 200 to protect the above second conductive layer 200. As shown in FIG. 9 to FIG. 11, a third conductive layer 300 of the gate driving circuit 01 is shown, and the third conductive layer 300 is disposed on one side of the second insulating layer 620 facing away from the base substrate 1000. Moreover, the third conductive layer 300 may include: at least one auxiliary line. One auxiliary line and one clock signal line are electrically connected through at least one ninth via hole H9, and the ninth via hole H9 penetrates through the second insulating layer 620.

In some embodiments, as shown in FIG. 9, the orthographic projections of the clock signal lines on the base substrate may be made to cover orthographic projections of the electrically connected auxiliary lines on the base substrate. Further, the orthographic projections of the clock signal lines on the base substrate may be made to be overlapped with the orthographic projections of the electrically connected auxiliary lines on the base substrate. In this way, an occupied area of the auxiliary lines may be reduced, so that an occupied area of the non-display region BB may be reduced.

In some embodiments, as shown in FIG. 9, the third conductive layer may include: a plurality of auxiliary lines; and one auxiliary line and one clock signal line are electrically connected through a plurality of ninth via holes H9. In this way, the resistance of each clock signal line may be reduced.

In some embodiments, as shown in FIG. 9, the ninth via holes H9 of every two adjacent clock signal lines may be arranged in a staggered mode. In this way, the ninth via holes H9 may be dispersedly disposed to improve the uniformity.

In some embodiments, as shown in FIG. 9, an orthographic projection of the ninth via hole H9 on the base substrate does not overlap with the orthographic projection of the first via hole H1 and the third via hole H3 on the base substrate, so that the accuracy of electrical connection can be improved.

Based on the same inventive concept, an embodiment of the present disclosure further provides a driving method of a display panel, including:

in one frame of scanning time, all shift register units are controlled to work sequentially to scan all driving lines row by row, wherein odd-numbered shift register units sequentially arranged in an extension direction of a clock signal line and even-numbered shift register units are independently driven under control of different clock signal line groups.

Figure 12:
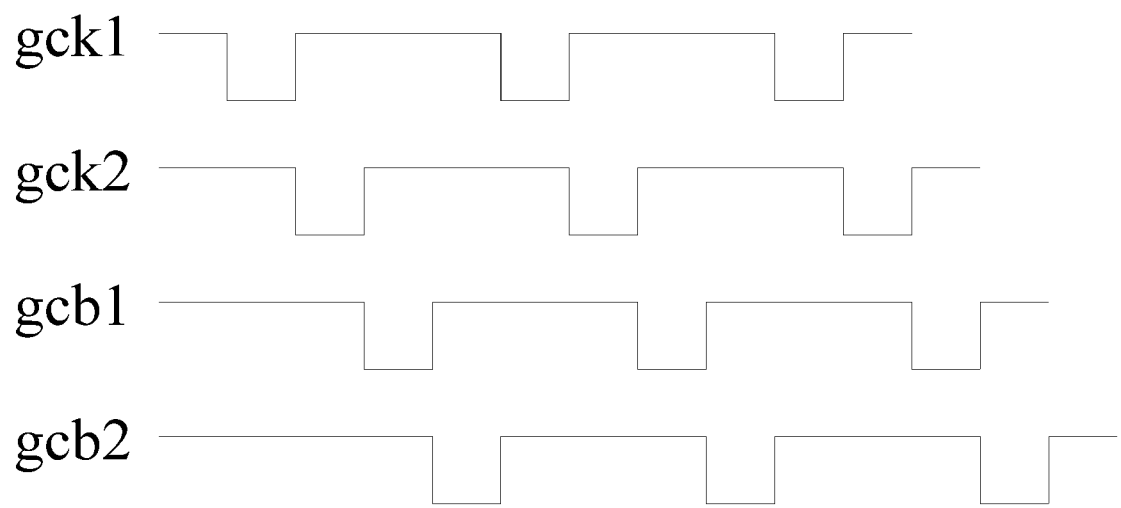
FIG. 12 is a signal sequence diagram of some other shift register units provided by an embodiment of the present disclosure.

Exemplarily, as shown in FIG. 4C, FIG. 6 and FIG. 12, within one frame scanning time, the odd-numbered shift register units (i.e., a first register unit group GOA-1) work under the control of clock signals input by a first clock signal line GCK1 and a second clock signal line GCB1 to input the signals to the electrically connected scan lines. Moreover, the even-numbered shift register units (i.e., a second register unit group GOA-2) work under the control of clock signals input by a third clock signal line GCK2 and a fourth clock signal line GCB2 to input the signals to the electrically connected scan lines. Thus all the scan lines may perform scanning row by row.

FIG. 12 shows a signal gck1 transmitted by the first clock signal line GCK1, a signal gcb1 transmitted by the second clock signal line GCB1, a signal gck2 transmitted by the third clock signal line GCK2, and a signal gcb2 transmitted by the fourth clock signal line GCB2.

An embodiment of the present disclosure further provides a driving method of a display panel, including: time, for maintaining active level, of signals applied to a plurality of clock signal lines in different clock signal line groups do not overlap with each other. For example, as shown in FIG. 12, the effective levels of the signals applied to the clock signal lines are low levels, and the low levels of the signals applied to all the clock signal lines do not overlap.

Based on the same inventive concept, an embodiment of the present disclosure further provides a display device, including the above display panel provided by the embodiment of the present disclosure. Implementation of the display device may refer to embodiments of the above display panel, and repetitions are omitted.

During specific implementation, in the embodiment of the present disclosure, the display device may be: any product or component with a display function, such as a mobile phone, a tablet computer, a television, a displayer, a notebook computer, a digital photo frame, and a navigator. It should be understood by a person of ordinary skill in the art that the display device should have other essential constituent parts, which is not repeated here and should not be regarded as limitation to the present disclosure.

Although the preferred embodiments of the present disclosure have been described, those skilled in the art can make additional modifications and variations on these embodiments once they know the basic creative concept. Therefore, the appended claim intends to be explained as including the preferred embodiments and all modifications and variations falling within the scope of the present disclosure.

Obviously, those skilled in the art can make various modifications and variations to the embodiment of the present disclosure without departing from the spirit and scope of the embodiment of the present disclosure. In this way, if these modifications and variations of the embodiments of the present disclosure fall within the scope of the claims of the present disclosure and their equivalent art, the present disclosure also intends to include these modifications and variations.

What is claimed is:

1. A display panel, comprising:
a gate driving circuit comprising: a plurality of clock signal lines, and a plurality of shift register units sequentially arranged in an extension direction of the clock signal lines, wherein the plurality of clock signal lines are divided into a plurality of clock signal line groups; wherein:
the plurality of shift register units are divided into a plurality of register unit groups, wherein all shift register units in a same register unit group are cascaded, two shift register units adjacent in the extension direction of the clock signal lines are located in different register unit groups, and the different register unit groups correspond to different clock signal line groups; and
each of the shift register units comprises an input transistor and an output transistor, wherein a gate of the input transistor is electrically connected to one clock signal line in a corresponding clock signal line group, a first pole of the input transistor is electrically to an input signal end, and a second pole of the input transistor is electrically connected to a gate of the output transistor; and a second pole of the output transistor is correspondingly and electrically connected to at least one of a plurality of driving lines;
a semiconductor layer located on the base substrate, and comprising active layers of the input transistor and the output transistor, wherein each of the active layers comprises a source region, a drain region, and a channel region between the source region and the drain region;
a gate insulating layer on one side facing away from the base substrate, of the semiconductor layer;
a first conductive layer on one side facing away from the base substrate, of the gate insulating layer, and comprising the plurality of driving lines, a plurality of first connection lines, a plurality of second connection lines, the gate of the input transistor and the gate of the output transistor, wherein one of the shift register units corresponds to at least one of the first connection lines and at least one of the second connection lines;
a first insulating layer on one side facing away from the base substrate, of the first conductive layer; and
a second conductive layer on one side facing away from the base substrate, of the first insulating layer, and comprising a plurality of data lines, the plurality of clock signal lines and a plurality of first transfer parts.

2. The display panel according to claim 1, further comprising: a base substrate comprising a display region and a non-display region;
wherein the display region comprises:
a plurality of subpixels arranged in a matrix along a plurality of rows and a plurality of columns;
the plurality of driving lines, wherein one row of the subpixels is correspondingly and electrically connected to at least one of the plurality of driving lines; and
the plurality of data lines wherein one column of the subpixels is correspondingly and electrically connected to at least one of the plurality of data lines;
wherein the non-display region comprises: the gate driving circuit;
wherein one of the plurality of first transfer parts is electrically connected to the source region of the active layer of one output transistor; and the second conductive layer further comprises: a first power line, wherein for one shift register unit and the clock signal line group corresponding to the shift register unit, one end of the first connection line is directly electrically connected to the gate of the input transistor in the shift register unit, other end of the first connection line is electrically connected to one clock signal line in the clock signal line group through a first via hole, one end of the second connection line is electrically connected to the first transfer part through a second via hole, and the other end of the second connection line is electrically connected to another clock signal line in the clock signal line group or the first power line through a third via hole; and the first via hole, the second via hole and the third via hole penetrate through the first insulating layer and are formed at intervals.

3. The display panel according to claim 2, wherein the plurality of clock signal lines is divided into two clock signal line groups, the two clock signal line groups comprise a first clock signal line group and a second clock signal line group, the first clock signal line group comprises a first clock signal line and a second clock signal line, and the second clock signal line group comprises a third clock signal line and a fourth clock signal line;

the plurality of shift register units is divided into two register unit groups, the two register unit groups comprise a first register unit group and a second register unit group, the first register unit group comprises odd-numbered shift register units sequentially arranged in the extension direction of the clock signal lines, and the second register unit group comprises even-numbered shift register units sequentially arranged in the extension direction of the clock signal lines;

for the plurality of shift register units cascaded in the first register unit group, a gate of the input transistor of an odd-numbered level of shift register units is electrically connected to the first clock signal line through a corresponding first connection line, and a first pole of the output transistor of the odd-numbered level of shift register units is electrically connected to the second clock signal line or the first power line through a corresponding second connection line; and, a gate of the input transistor of an even-numbered level of shift register units is electrically connected to the second clock signal line through a corresponding first connection line, and a first pole of the output transistor of the even-numbered level of shift register units is electrically connected to the first clock signal line or the first power line through a corresponding second connection line; and for the plurality of shift register units cascaded in the second register unit group, a gate of the input transistor of an odd-numbered level of shift register units is electrically connected to the third clock signal line through a corresponding first connection line, and a first pole of the output transistor of the odd-numbered level of shift register units is electrically connected to the fourth clock signal line or the first power line through a corresponding second connection line; and, a gate of the input transistor of an even-numbered level of shift register units is electrically connected to the fourth clock signal line through a corresponding first connection line, and a first pole of the output transistor of the even-numbered level of shift register units is electrically connected to the third clock signal line or the first power line through a corresponding second connection line.

4. The display panel according to claim 3, wherein each of the shift register units further comprises a voltage-stabilizing transistor, a second pole of the input transistor is electrically connected to a first pole of the voltage-stabilizing transistor, and a second pole of the voltage-stabilizing transistor is electrically connected to the gate of the output transistor; and the second conductive layer further comprises: the first power line; a gate of each voltage-stabilizing transistor is electrically connected to the first power line through a fourth via hole, wherein the fourth via hole penetrates through the first insulating layer.

5. The display panel according to claim 4, wherein in a same gate driving circuit, an orthographic projection of the input transistor on the base substrate is between an orthographic projection of the first power line on the base substrate and orthographic projections of the plurality of clock signal lines on the base substrate;

an orthographic projection of the voltage-stabilizing transistor on the base substrate is on one side of the orthographic projection of the first power line on the base substrate facing away from the orthographic projections of the plurality of clock signal lines on the base substrate; and an orthographic projection of the output transistor on the base substrate is on one side of the orthographic projection of the voltage-stabilizing transistor on the base substrate facing away from the orthographic projection of the first power line on the base substrate.

6. The display panel according to claim 3, wherein each of the shift register units further comprises a first control transistor and a second control transistor;

the semiconductor layer further comprises an active layer of the first control transistors and active layers of the second control transistors;

the first conductive layer further comprises: the gate of the first control transistors and the gate of the second control transistors;

the second conductive layer further comprises: a second power line, a plurality of second transfer parts, and a plurality of third transfer parts, wherein one second transfer part corresponds to one first control transistor, and one third transfer part corresponds to one second control transistor;

the display panel further comprises:

a fourth conductive layer between the first insulating layer and the second conductive layer, and the fourth conductive layer comprises a plurality of first conductive parts, wherein one first conductive part corresponds to one second control transistor; and a third insulating layer between the fourth conductive layer and the second conductive layer; wherein the gate of the first control transistor is directly electrically connected to a corresponding first connection line, a source region of the active layer of the first control transistor is electrically connected to the first power line through a fifth via hole, a drain region of the active layer of the first control transistor is electrically connected to a gate of the second control transistor through a corresponding second transfer part, and the fifth via hole penetrates through the first insulating layer and the third insulating layer; and a source region of the active layer of the second control transistor is electrically connected to one end of a corresponding third transfer part through a sixth via hole, the other end of the third transfer part is electrically connected to one end of a corresponding first conductive part through a seventh via hole, the other end of the first conductive part is electrically connected to the second power line through an eighth via hole, and a drain region of the active layers of the second control transistor is shared with the drain region of the active layer of the output transistor, wherein the sixth via hole penetrates through the first insulating layer and the third insulating layer, and the seventh via hole and the eighth via hole penetrate through the third insulating layer.

7. The display panel according to claim 6, wherein an orthographic projection of the second power line on the base substrate is between the orthographic projections of the plurality of clock signal lines on the base substrate and an orthographic projection of the gate driving circuit on the base substrate;

in each of the shift register units, an orthographic projection of the first control transistor on the base substrate is between the orthographic projection of the input transistor on the base substrate and the orthographic projection of the first power line on the base substrate; and in each of the shift register units, an orthographic projection of the second control transistor on the base substrate is on one side facing away from the orthographic projection of the first power line on the base substrate, of the orthographic projection of the input transistor on the base substrate.

8. The display panel according to claim 7, wherein in the shift register units, the active layer of the output transistor and the active layer of the second control transistor are disposed in an integrated structure.

9. The display panel according to claim 6, wherein each of the shift register units further comprises: a first capacitor and a second capacitor, a first pole of the first capacitor is electrically connected to the second power line, and a second pole of the first capacitor is electrically connected to the gate of the second control transistor; and a first pole of the second capacitor is electrically connected to the second pole of the output transistor, and a second pole of the second capacitor is electrically connected to the gate of the output transistor;

the fourth conductive layer further comprises a plurality of second conductive parts, wherein one second conductive part corresponds to one output transistor;

an orthographic projection of each of the first conductive parts on the base substrate and an orthographic projection of the gate of a corresponding second control transistor on the base substrate have an overlapped region, each of the first conductive parts serves as a first pole of a corresponding first capacitor, and the gate of the second control transistor serves as a second pole of the corresponding first capacitor; and an orthographic projection of each of the second conductive parts on the base substrate and an orthographic projection of the gate of a corresponding output transistor on the base substrate have an overlapped region, each of the second conductive parts serves as the first pole of a corresponding second capacitor, and the gate of the output transistor serves as the second pole of the corresponding second capacitor.

10. The display panel according to claim 9, wherein orthographic projections of gates of second control transistors on the base substrate cover orthographic projections of the first conductive parts on the base substrate.

11. The display panel according to claim 10, wherein the orthographic projections of the gates of the second control transistors on the base substrate and the orthographic projections of the first conductive parts on the base substrate respectively have overlapped regions with the orthographic projections of the first power lines on the base substrate.

12. The display panel according to claim 6, wherein an orthographic projection of the eighth via hole on the base substrate is between the orthographic projections of the first power lines on the base substrate and the orthographic projections of the second power lines on the base substrate, and an orthographic projection of the seventh via hole on the base substrate is between the orthographic projections of the first power lines on the base substrate and the orthographic projection of the active layer of the second control transistor on the base substrate.

13. The display panel according to claim 2, further comprising:

a second insulating layer located on one side facing away from the base substrate, of the second conductive layer;

a third conductive layer located on one side facing away from the base substrate, of the second insulating layer, and comprising: at least one auxiliary line, wherein one auxiliary line and one clock signal line are electrically connected through at least one ninth via hole, and the at least one ninth via hole penetrates through the second insulating layer.

14. The display panel according to claim 13, wherein the orthographic projections of the clock signal lines on the base substrate cover orthographic projections of the auxiliary lines electrically connected with the clock signal lines on the base substrate.

15. A display device, comprising the display panel according to claim 1.

16. A driving method of the display panel according to claim 1, comprising:

in one frame of scanning time, controlling all shift register units to work sequentially to scan all driving lines row by row, wherein odd-numbered shift register units and even-numbered shift register units sequentially arranged in an extension direction of a clock signal line are independently driven under control of different clock signal line groups.

17. A driving method of the display panel according to claim 16, comprising: time, for maintaining an active level, of signals applied to a plurality of clock signal lines in different clock signal line groups do not overlap with each other.

* * * * *